United States Patent [19]

Zingher

[11] 4,443,278
[45] Apr. 17, 1984

[54] INSPECTION OF MULTILAYER CERAMIC CIRCUIT MODULES BY ELECTRICAL INSPECTION OF GREEN SPECIMENS

[75] Inventor: Arthur R. Zingher, Elmsford, N.Y.

[73] Assignee: International Business Machines Corporation, Armonk, N.Y.

[21] Appl. No.: 267,272

[22] Filed: May 26, 1981

[51] Int. Cl.³ .................... B32B 31/12; B32B 31/16; B32B 31/28
[52] U.S. Cl. .................................... 156/64; 29/830; 73/159; 156/89; 156/379; 174/68.5; 428/901
[58] Field of Search .................... 73/159; 156/64, 378, 156/89, 379; 29/830; 174/68.5; 428/901

[56] References Cited

U.S. PATENT DOCUMENTS 4,242,157  12/1980  Gehle .................................... 156/64

OTHER PUBLICATIONS

Kaiser et al., "A Fabrication Technique for Multilayer Ceramic Modules", Solid State Technology, May 1972, pp. 35-40.

Primary Examiner—Robert A. Dawson
Attorney, Agent, or Firm—Graham S. Jones, II

[57] ABSTRACT

A method of manufacturing packages for LSI chips starts with the usual steps of punching holes in green sheets, screening patterning paste (adapted to form cermet conductors or the like after firing) onto the green sheet, and inspecting the green sheets optically. Here, subsets of green sheets are then stacked and compressed into sublaminates. The sublaminates are then functionally inspected electrically. Inspection is done by means of electromechanical contact, scanning electron microscope like techniques, or by other means of irradiating the conductors to energize them for electrical measurement. Measurement may be made between pairs of terminals on only one side of the device being tested, or on both sides of the device. Beams can be applied both top and bottom from a single source or plural sources. Measuring instruments employ various electromechanical techniques as well as electrons, light used photoelectrically, ions, or pneumatic ion jets. Secondary electrons can measure the specimen's potential locally or change its charge. This method can also be employed for the purpose of inspecting other multilayer structures (such as large multilayer printed circuits formed on a plastic base) prior to final assembly of the conductors and the various substrates into a laminated support for electrical circuits. This testing process can also be applied after firing of patterned green sheets prior to plating, as well as after plating.

32 Claims, 18 Drawing Figures

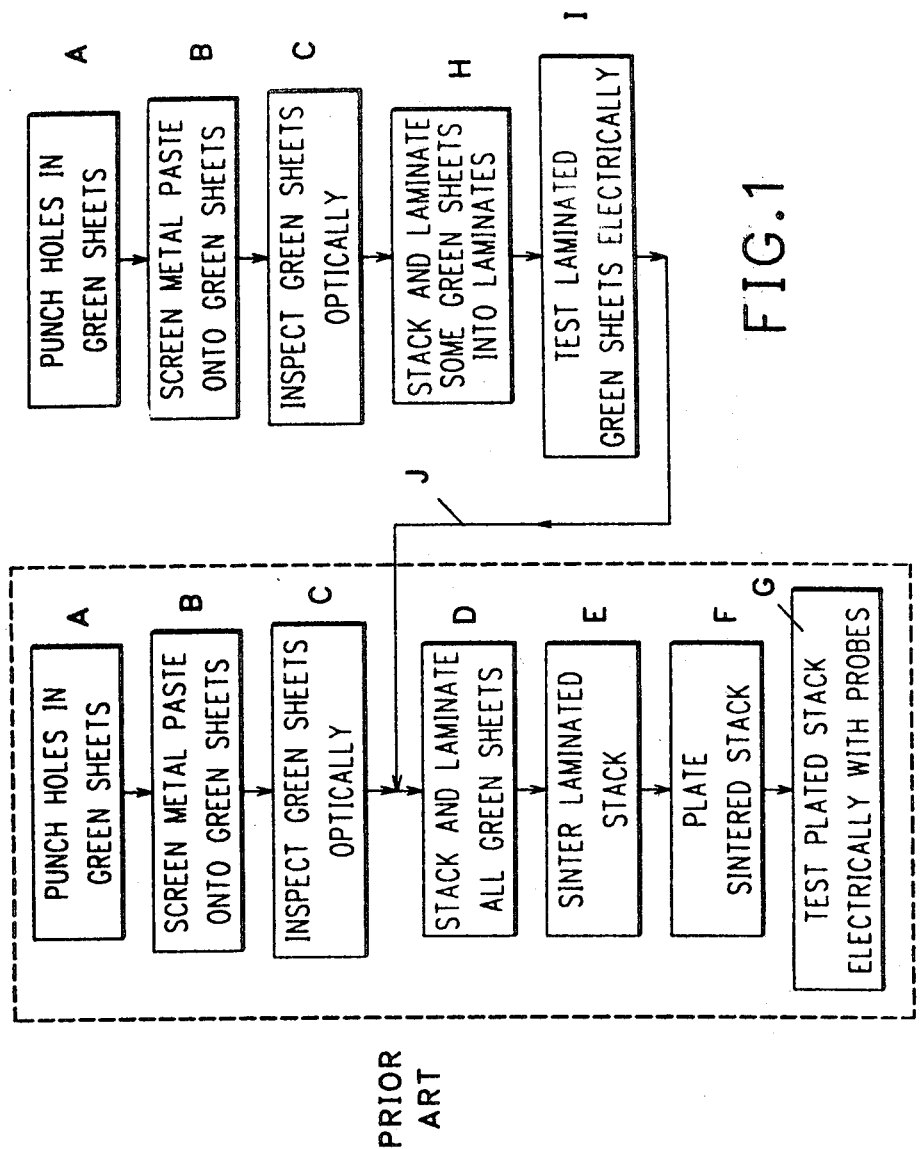

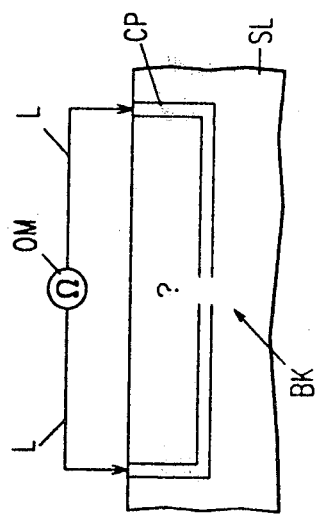
FIG. 2.1
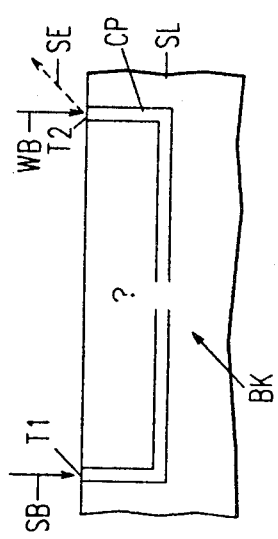
FIG. 2.2
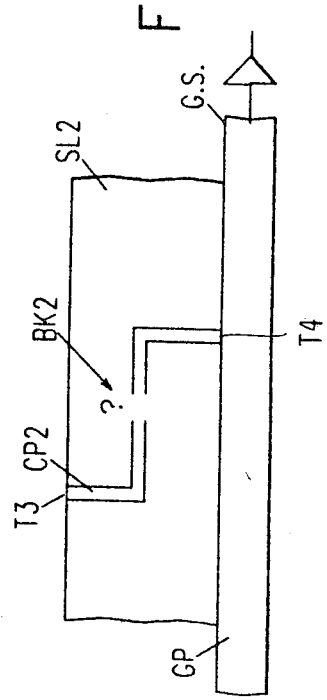
FIG. 2.3

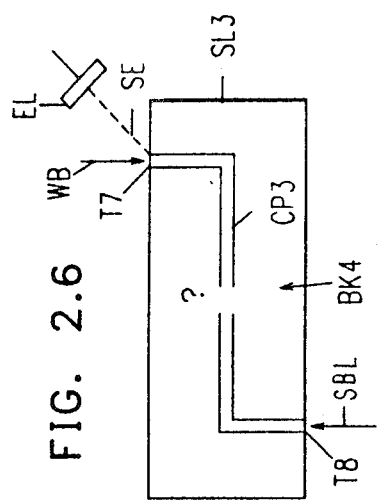
FIG. 2.6
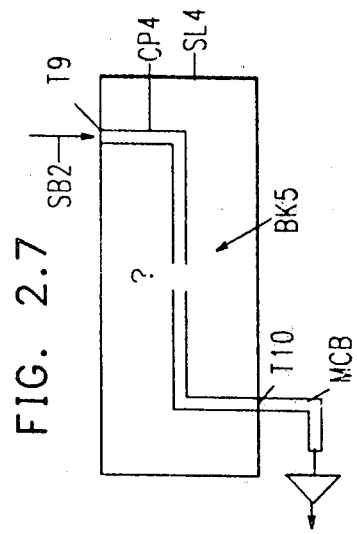
FIG. 2.7
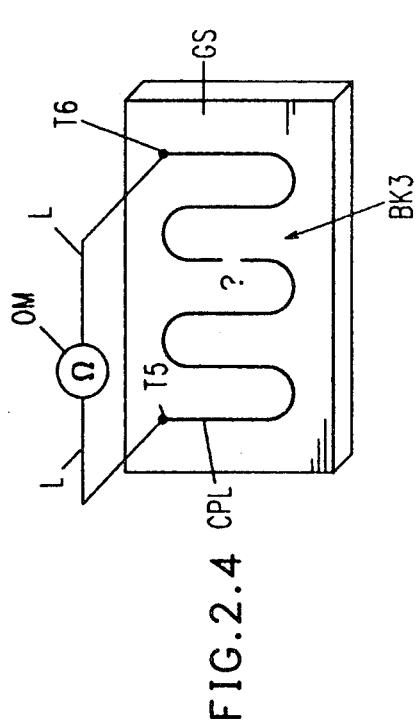
FIG. 2.4
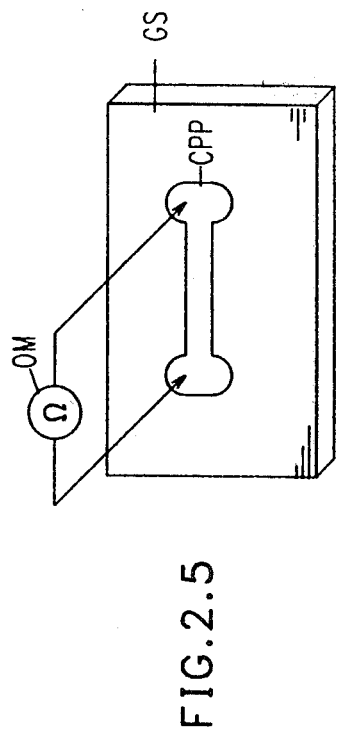
FIG. 2.5

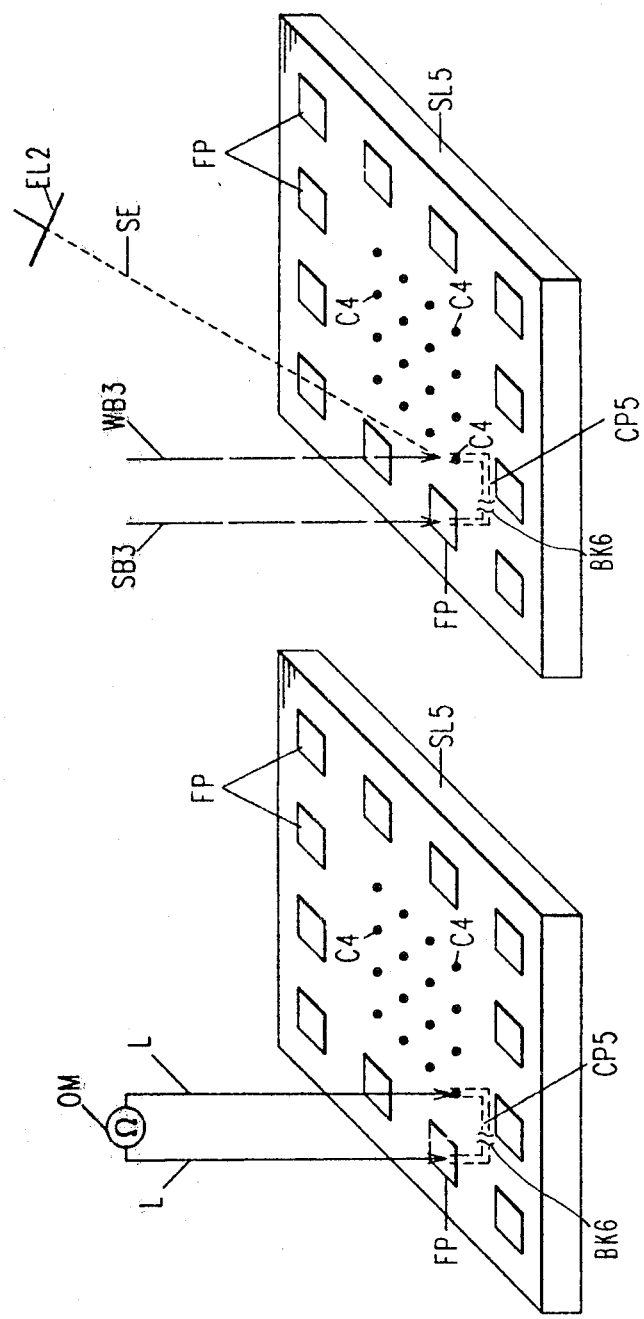
FIG. 3.2
FIG. 3.1

INSPECTION OF MULTILAYER CERAMIC CIRCUIT MODULES BY ELECTRICAL INSPECTION OF GREEN SPECIMENS

DESCRIPTION

Background of the Invention

This invention relates to carriers for integrated circuit chips and more particularly to the system of manufacture of such carriers or packages from green sheet form including inspection of the unfired green sheets covered with a patterning paste composed of a binder and conductive or metallic particles.

Description of References

Multilayered Ceramic Circuit packaging modules are employed in the electronics industry today for carrying large scale integrated circuit chips. Multiple layers of unfired ceramic material known as green sheets are prepared and perforated in desired patterns. Fabrication uses a metallic-organic paste referred to as "patterning paste". Initially it has such extremely high electrical resistance as to be regarded as an insulator. The paste is screened onto the ceramic layers. Each green sheet which has been screened with the patterning paste is optically inspected for defects. Then the layers are assembled in a predetermined aligned form, laminated, and fired. The insulating materials in the paste are driven off during firing, leaving material (usually metallic) which forms conductive patterns. The paste is also referred to as "conductive paste" although its conductivity changes from an insulator to a conductor during processing.

FIG. 7 shows a portion of a completed multi-layer ceramic (MLC) packaging substrate. Each of the layers making up the substrate begins as a flexible unfired sheet (green sheet) of soft ceramic material. Holes (vias) are punched in the green sheets in known patterns.

The patterning paste is then printed or screened through a metal mask to form predetermined wiring patterns on the green sheet and to fill its via holes. The completed substrate is fabricated by stacking multiple green sheet layers that are pressed together to form a semi-hard stack or laminate, which is fired. The result is a high performance substrate for VLSI chips, with improved reliability and reduced manufacturing cost.

Many VLSI chips are mounted on top of the substrate which establishes all electrical connections to and between chips. On the top surface of the substrate, each chip site is composed of a central array of chip connection vias (C4 pads or microsockets) surrounded by one or more frames of engineering change (EC) pads. The EC pads allow correction of wiring defects by the deletion of internal wiring and its replacement with discrete surface wires.

The substrate is composed of three main regions of layers: signal redistribution, signal distribution (personalization) and power distribution. The top several layers of the substrate redistribute the signal lines from the central array of chip connection vias, first to the surrounding EC pads and then down to the signal distribution layers. The substrate's central signal distribution layers carry signals between chips and to and from input/output lines. They also provide reference signal levels to the chips. The bottom power layers distribute power and redistribute signals to the bottom surface pin pads.

The signal redistribution and power distribution layers contain fixed wiring patterns while the signal distribution layer wiring varies by substrate part number.

Green sheets are pressed together to form laminates. Defects can occur at this point in the manufacturing process such as opens in the via connections, opens in the horizontal line connections and shorts between lines. Following lamination, the stack of green sheets is fired in kilns to produce a multi-layer ceramic (MLC) substrate in the form of a tile.

Given these processing steps, inspection subsequent to firing, when the material is more easily handled, results in discarding defective modules after significant costs have already been incurred. Inspection prior to firing, while preferred on a cost basis, has been restricted to optical inspection due to the nature of the deficiencies in existing inspection technology.

Cost and yield considerations in the manufacture of integrated circuit semiconductor packages mandates the definition of a system to inspect for defects at an early point in the manufacturing process. Due to the extreme miniaturization in the size of these devices, and the conductors used, conventional electrical inspection and testing techniques employing contactors at conductor ends has become increasingly difficult. The high density of conductor ends, uneven leveling and their close proximity to each other are all factors contributing to this difficulty. Moreover, such inspection conventionally occurs at a point, generally after firing, in the manufacturing process where significant costs such as preparing many layers, plating and heat processing have already occurred. Discarding a module at that manufacturing point is not cost effective. Additionally with the introduction of multi-layer packaging, MLC devices, conventional optical inspection can no longer be performed to determine the continuity of conductor lines. Such optical techniques are limited by resolution and a general inability to detect certain types of line and microsocket (via) defects.

The difficulties in inspecting these devices is compounded by the inherent nature of the patterning paste. The patterning paste deposited on unfired ceramic substrates (green sheets) has a paste-like consistency, posing the risk that physical contact destroys the specimen during testing by introducing surface defects not previously disposed in the material. Accordingly, visual, as well as automatic optical inspection of a single green sheet has been used to detect surface defects in the green sheet material. These defects include erroneously punched or missing via-holes, incompletely filled via-holes and defects in screened connection lines. Such inspection is not sufficiently effective to determine electrical defects such as shorts and opens in an acceptable percentage of cases.

Prior to lamination, it has been the practice to utilize visual or optical inspection techniques such as lasers to discern visually or optically identifiable defects in the patterning paste structure. However, the process has been improper in that no electrical inspection has been utilized prior to firing of the modules because the patterning paste utilized is an insulating material until after it has been fired. During firing, the organic components of the patterning paste including the binder material which is organic, and the solvent which is a liquid such as a polar solvent and aliphatic ink oil are driven off from the patterning paste. This leaves only the conductive or metal particles carried in the patterning paste. In a substantial number of cases, it has been found that the conductivity of the metallization produced by the above process includes a high percentage of incomplete conductor lines and vias which lie upon or in the ceramic layers, which lines and vias pass from top to bottom and which are buried except at the ends of the lines, and any other combinations and permutations of the above. The failure of the optical inspection techniques to eliminate the defects is very costly and it is an objective of the invention to reduce such costs.

L. F. Miller in an article entitled "E. H. E. C. in MLC Pastes", IBM Technical Disclosure Bulletin 20, No. 8 3071 (Jan. 1978) describes a patterning paste suitable for screening onto green sheets of ceramic material in MLC packaging. The paste includes the ink oil, polar solvent and organic binder material as well as metallic particles.

B. Kaplan et al in "Thick Film Conductive Paste System" at page 1864 of Oct. 1978 issue of the above publication describe another patterning paste for use in MLC substrates which uses nickel powder, a binder of ethyl cellulose (a dielectric material) and a solvent of 2,2,4-trimethylpentanediol-1,3 monoisobutyrate (a nonconductor).

U.S. Pat. No. 3,531,716 of Tarui et al for "Method of Testing an Electronic Device by use of an Electron Beam" describes the use of a first electron beam to project an electric potential onto a portion of the electronic device to be tested. When the electric potential is generated, it can be detected by sensing secondary electrons generated by directing a second weak electron beam at a second terminal of the conductor whose first terminal was hit by the first electron beam to receive the charge which produced the potential. A conductor extends between the two terminals and the patent shows a conductor passing below a multilayer structure wiring plate in the prior art.

Lancaster, "Dual Electron Beam Testing Probe" IBM Technical Disclosure Bulletin 12, No. 7 978 (Dec. 1969) shows circuit arrays with secondary electrons generated at one point from an E-beam B where E-beam A is applied at a distant point in the array. Beams A and B sweep across the circuit array.

U.S. Pat. Nos. 3,763,425 and 3,764,898 are also directed to a form of electron beam testing of the electrical continuity of an electrical conductor.

U.S. Pat. Nos. 3,763,425 and 3,764,898 both relate to non-contact continuity testing of conductors utilizing electron beams. Both measure the resistance of conductors on or embedded in an insulating matrix. A pair of individually controlled electron beams are used which must simultaneously address both ends of the conductor under test. In both patents, special masks are employed, individually tailored to the configuration of conductors of the specimen under test. As shown, for example, in FIG. 3 of the '898 patent, the mask may be a complex structure that makes loading and unloading of specimens difficult, thereby inhibiting throughput in manufacturing lines. In both patents, the masks stabilize the potential on the specimen surface and act as collecting and measuring electrodes. In the case of the '425 patent, the masks are used to generate secondary electrons for excitation of the target. Optimization of the operating parameters of the system can be attained, but only with a throughput penalty resulting from interference in the changing of specimens due to the use of such masks. Other systems utilizing mask techniques include U.S. Pat. Nos. 3,678,384 and 4,164,658.

U.S. Pat. No. 3,373,353 of Harris for "Electron Beam Scanning System for Quality Control of Materials" describes the use of an E-beam scanning system on thin dielectric films wherein an electric field is established across the dielectric film by scanning an E-beam across the film and then applying a sensing means to detect any current flowing through the dielectric film under test.

U.S. Pat. No. 4,056,716 of Baxter et al for "Defect Inspection of Objects such as Electronic Circuits" describes scanning ceramic green sheets past a flying-spot scan line from a flying-spot scanner and comparing the image detected with the image stored in a storage unit to a master pattern by means of apparatus such as a general-purpose digital computer. Conductive lands on a green sheet are sensed and indicated by "x" marks while blank spaces represent the insulating ceramic background. It is believed that the inspection being referred to here is an optical inspection which may fail to reveal defects in electrical characteristics.

Gill et al in "Contactless Probing of Hybrid Substrates" 2, No. 2, pp 54–58, The International Journal for Hybrid Electronics, (Fall 1979) describes the use of secondary electrons for contactless probing of hybrid substrates such as multilayer thick-film substrates. "This technique which requires no contact with the substrates has been successfully applied to several different thick-film substrates. Control of the parameters of accelerating voltage, primary beam current and time of beam probing can control the surface potential for a metallization pattern."

Additional patents include U.S. Pat. No. 3,549,999 of Norton, U.S. Pat. No. 3,772,520 of Varker, U.S. Pat. No. 4,071,759 of Namae, U.S. Pat. No. 4,169,244 of Plows, U.S. Pat. No. 4,219,731 of Migitaka et al, U.S. Pat. No. 4,037,101 of Okumura et al, U.S. Pat. No. 4,068,381, of Ballard et al, U.S. Pat. No. 4,172,228 of Frosch et al, U.S. Pat. No. 3,684,960 of Conley et al, for a "Probe and Determining Location of Conductive Features", U.S. Pat. Nos. 4,220,853 and 4,220,854 of Feuerbaum et al, and publications in the IBM Technical Disclosure Bulletin as follows:

DeGroat et al, "Finding Shorts in Printed Circuit Boards", 12, No. 5 655 (Oct. 1969).

Dodd et al, "Printed-Circuit Tester" 16, No. 9, 2848-9 (Feb. 1974).

Radzik, "Circuit Net Detector Module" 19, No. 8, 3123-4 (Jan. 1977).

Cukier et al, "Test Unit for Printed-Circuit Cards", 21, No. 9, 3657-8 (Feb. 1979).

Morrissey, "Scanning Electron Microscope Stage for Testing Integrated Circuits", 23, No. 7A, 2803-4 (Dec. 1980).

The prior art also includes a number of proposals to use electron beam techniques in diagnostic analysis of electronic circuits. U.S. Pat. No. 4,139,774 relates to an electron beam apparatus that eliminates specimen staining which is caused by contamination in vacuum pumps. The system is designed for specimen surface analysis and not electrical testing. U.S. Pat. No. 4,172,228 utilizes a scanning electron microscope (SEM) to irradiate selected areas of an integrated circuit until failure occurs. U.S. Pat. No. 4,169,244 relates specifically to electron probes for testing electronic networks. The system requires electrical stimulation of the unit under test by the means of external electronics.

IBM Technical Disclosure Bulletin, Vol. 12, No. 7, Dec. 1969 discloses in very general terms the use of two separately controlled but simultaneously active scanning electron beams. The system is therefore similar to that disclosed in U.S. Pat. Nos. 3,763,425 and 3,764,898.

The beams are focused at two distinct points in the array and the potential which exists at one energizing point is measured by capturing scattered secondary electrons with a pickup and measuring device.

IBM Technical Disclosure Bulletin, Vol. 23, No. 5, Oct. 1980, discloses a system that generates a voltage contrast at test points of a specimen utilizing a scanning Auger microprobe (SAM) or a scanning electron microscope (SEM) by biasing the specimen. The testing of IC chips occurs where the biasing corresponds to binary zero and one logic levels.

Although the system is contactless and utilizes a commercially available electron beam instrument, it is not suited for testing large area specimens having a dielectric matrix or when physical electrical connections to the specimen are not present. Another SEM technique for testing IC chips is disclosed in IBM Technical Disclosure Bulletin, Vol. 23, No. 7A, Dec. 1980. The system is not contactless, utilizing multiple connections to the chips on a module to drive them. The system is therefore not suitable for soft unfired multilayer ceramic materials.

SUMMARY OF THE INVENTION

An object of this invention is to overcome the problem of poor yields in multilayered ceramic modules and packages for chips by reducing the percentage of poor electrical vias and conductor lines on and within the modules by inspection prior to firing of the green sheets.

Another object of this invention is to perform the testing of the green sheets in a manner calculated to minimize the amount of inspection time required before the costly procedures associated with final assembly and firing have been undertaken.

An object of this invention is to overcome the problem with breaks in patterning paste lines and in patterning paste via columns in green sheet laminate. This is compounded because the breaks which are not detected by optical inspection are detected very late in the assembly of the MLC carrier packages when the cost of materials and fabrication are nearly maximum.

Another object of this invention is to uncouple fabrication of such products into a subassembly process. Thus subassemblies can be independently fabricated, inspected and stored with assurance, prior to final assembly into complete units. This subassembly product greatly improves production logistics and reliability. It is desired to employ early inspection techniques which reduce the number of lost units caused by ultimate rejection of the fired carriers. The object is also to improve the quality of the ultimate product as well as improving the yield.

It should also be noted that optical inspection techniques cannot detect poor contact in columns of vias of patterning paste which lead to lack of continuity of the vias between layers of the MLC stack. At the end of the process of assembly and firing, as presently practiced, techniques of electrical inspection subsequent to electroplating of the fired tiles are definitive. However, inspection occurs so late that rejects are costly and the possible repairs are limited thereby risking the loss of the entire product which is extremely expensive, at that stage. It is an object to detect such defects prior to firing in an economical manner.

Since the unlaminated patterning paste is soft and of extremely high resistivity it is desired to provide a way to test the patterning paste which will not damage the specimen, yet which is economical to employ in a mass production environment.

Given the complexity of the package, sublamination techniques have been proposed to significantly reduce the manufacturing capacity needed to produce a given number of MLC substrates. Sublamination comprises dividing a stack of green sheets needed to produce a complete substrate into several sub-stacks. Typical are power/voltage, personalization and, redistribution sub-stacks. These sub-stacks, comprising in the order of several tens of layers in some cases, are fabricated, pressed to form sublaminates, and independently tested. A set of inspected sublaminates is then pressed to form a completed unfired stack or laminate. Given these manufacturing steps, an electrical inspection capability to determine whether open or short circuit conditions exist in a variety of different connection paths is essential. This test capability should exist prior to firing the laminates so that defective sublaminates may be discarded prior to completing the laminate. It is crucial that the rate of testing be commensurate with the rate of manufacture of the substrates so that "on-line" testing can take place.

Sublaminates in the unfired state are formed from materials that are soft and easily damaged. Accordingly, prior art testing techniques utilizing some form of mechanical contact cannot be readily employed with these substrates without suitable modifications. Mechanical contact upon the soft sublaminate structure can easily introduce depressions into the microsockets which are required to be dent free. Additionally, some external level variations are acceptable if the vias are only partially filled with patterning paste. A partial filling of vias occurs randomly and results in the imposition of conflicting requirements if mechanical contacting is employed. Such techniques must be able to contact lines which are several mils high as well as over filled, filled and partially filled vias, simultaneously.

An additional problem is the extremely high electrical resistance of the patterning paste at this stage. Compared to most electrical inspection techniques used on the finished MLC products, the patterns falsely appear to be insulators. An especially high impedance technique is needed to distinguish truly broken circuits from high impedance unbroken circuits.

Inspection using human operators is not compatible with current manufacturing rates. Computer controlled handling techniques, however, are well established.

In accordance with this invention a method is provided for manufacture of ceramic electronic substrates comprising, printing a number of unfired ceramic sheets with a paste to form ultimately electrically conductive patterns, and electrically inspecting at least one of the unfired sheets.

The method of manufacture of ceramic laminated electronic packaging substrates comprises, screening a number of unfired ceramic sheets with a paste including conductive particles and an insulating material placing at least one of the unfired sheets in a device for electrically inspecting the pattern formed by the paste upon the sheets, comparing thus measured parameters of the pattern with a predetermined set of parameters, rejecting sheets having improper electrical parameters, and assembling sheets having a proper set of parameters into complete assemblies, and then laminating by compression, sintering and plating to form the finished substrate, thereby avoiding the waste attendant with employing sheets with improper electrical parameters.

In another aspect, the method of manufacturing multi-layered-ceramic laminated electronic packaging substrates comprising, screening a number of unfired ceramic sheets, to be assembled in a multi-layered ceramic structure, with a pattern of paste having an electrical resistance greater than about $10^5$ ohms, the screened paste being patterned to form electrically conductive patterns in or on the sheets subsequent to firing of the unfired ceramic sheets, electrically inspecting at least one of the unfired sheets with an electrical device for determining the value of the electrical continuity of the conductive pattern formed in or on the sheet, rejecting sheets having an improper value of electrical continuity, and assembling the remaining sheets into complete assemblies in accordance with conventional techniques, thereby avoiding the waste attendant to improper sheets in assembling the packages.

The above method can include a subset of sheets stacked and laminated to form a laminate prior to electrical inspection, whereby defects can be detected more efficiently prior to firing of the laminate.

Further, the subsets of the sheets can be stacked and laminated to form sublaminates, electrically inspecting the sublaminates to determine the electrical parameters of at least one thereof, and assembling the sublaminates into a composite stack and then laminating the composite stack into a complete unit.

The method of manufacturing of laminated electronic substrates in accordance with this invention includes, applying an electrical circuit pattern to a sheet of material and electrically inspecting the sheet prior to assembly into the laminated form, and then laminating the sheet with other sheets.

The method includes testing electrical connections provided by an insulating pattern material in a matrix of a less conductive insulation-material comprising, passing a current through the insulating pattern material and applying an electrical measuring apparatus to measure the current by means of (a) electromechanical contact, and/or (b) nonmechanical electrical testing.

In another aspect of the invention a method of testing electrical connections provided by an insulating patterning material passing through a less conductive insulative matrix without physical contact, including the steps of:

irradiating one terminal of the material with a beam to electrically stimulate the material;

irradiating a different terminal of the material with a beam to sense emission to sense an electrical response.

The method of testing for continuity and an open circuit condition in electrical connections provided by insulating material passing through a less conductive insulative matrix, also including the steps of:

applying a first electron beam to one end of the insulating material;

scanning the opposite end of the material with a steerable second electron beam; and detecting the emission of secondary electrons emitted from the opposite surface to determine electrical conduction or interruption through the electrical connections.

The method of determining the status of electrical connections provided by an insulating material passing through a less conductive insulative matrix without contacting the connections includes the steps of:

charging without mechanically contacting one end of the material to give charge using a first electron beam, another portion of the material a second electron beam to generate secondary electron emissions; and directing without mechanical contacting;

discriminating by detecting the variation in energy level of secondary electrons and their intensity, to determine whether the electrical connections have electrical continuity or are open.

A method of testing electrical connections provided by an insulating material passing through a less conductive insulative matrix without physical contact, including the steps of:

irradiating one side of the insulating material with a first electron beam to charge the material and the electrical connection to given potential;

generating a second electron beam on an opposite side of the material to cause secondary electron emission from conductors which are at the given potential; and detecting the presence of conductors not at a given potential.

A method of testing for continuity and open circuit conditions in electrical connections provided by insulating material passing through a less conductive insulative matrix including the steps of:

applying an electron beam to one side of the material;

scanning the opposite side of the material with a steerable electron beam; and detecting the emission of secondary electrons emitted from the opposite surface to determine electrical conduction or interruption through the electrical connections.

A method of determining the status of electrical connections provided by an insulating material passing through a less conductive insulative layer without contacting the connections includes the steps of:

charging without contacting one side of the insulating material and the connections to a potential using a first electron beam;

directing without contacting the opposite side of the material a second electron beam to generate secondary electron emissions; and discriminating by detecting the variation in energy level of secondary electrons and their intensity to determine whether the electrical connections have electrical continuity or are open.

A method of testing electrical connections by conductors extending through an insulating material without physical contact including the steps of:

irradiating the electrical conductor on one portion of said insulating material with a beam to charge the conductor to a given potential; and irradiating a beam on a different portion of the material to cause secondary electron emission from the conductor.

A method of determining the status of electrical conductors in an insulative layer without contacting the conductors includes the steps of:

charging without contacting conductors on one side of the insulative layer to a given potential using a first electron beam;

directing without contacting the opposite side of a layer a second electron beam to generate secondary electron emissions; and discriminating by detecting the variation in energy level of secondary electrons and their intensity to determine whether the electrical conductors have electrical continuity or are open.

As used herein, the terms "insulator" or "insulating material" are employed in the sense of a "poor conductor of electricity." Webster's Seventh New Collegiate Dictionary, G. & C. Merriam Company, 1967.

BRIEF DESCRIPTION OF THE DRAWINGS

FIG. 1 shows a flow chart of the method of the prior art in the dotted box to the left and the modified method of the instant invention outside the dotted box to the right, which continues with the final steps of the original method.

FIGS. 2.1–2.7 show several measurement techniques employed in connection with the instant invention to determine the electrical characteristics of the patterning paste used to form the conductive portions of carriers for LSI chips, prior to the firing of the carriers while they are in the so-called green form.

FIGS. 3.1 and 3.2 illustrate the measurement techniques of FIGS. 2.1 to 2.7 in a three-dimensional way with a more representational schematic of the green carrier sublaminate being tested.

DESCRIPTION OF THE PREFERRED EMBODIMENT

Figure 4:
FIG. 4 is an illustration of the prior art process of assembly and inspection of green sheets to form a ceramic tile carrier.

I performed tests of some electrical properties of unfired patterning paste lines, and found that surprisingly while their electrical resistance was extremely high that their continuity can be electrically tested and inspected using an appropriate technique.

Having been incorrectly advised that there is no D.C. conductivity of unfired patterning paste, I sought to measure an A.C. reactive component of conductance of the unfired paste.

One test used 10 mil diameter indium ball contacts on coaxial micromanipulator probes and applied 50 V at 1 MHz. Between the ends of a patterning paste signal line about 250 mils long, there was about 3 megohms in-phase resistance. When the line was carefully cut with a fine scalpel, this electrical resistance increased much more than 100-fold. The orthogonal-phase resistance was large and unchanged by cutting. Using DC at a few volts, between the ends of a 100 mil signal line there was 0.7 megohms before cutting, and much more than 20 megohms after cutting. Thus I discovered the original information on D.C. resistance was incorrect, in that the resistance was merely extremely high. Subsequent laboratory work showed that cut circuits exceeded $10^{11}$ ohms.

These preliminary indications suggested continuity tests of lines and vias composed of patterning paste on individual green sheets, when repairs and rejections are relatively inexpensive, with mechanical microprobe arrays, or a scanning electron or ion beam probe. Proper contact was critical in the bench tests, and non-damaging, reliable contacts are critical for production inspection. Although lines and vias require different probe geometries, both can be inspected.

Using indium ball contacts, a high impedance ohm-meter, which applied 1 VDC, showed megohm range conductivity in all unbroken specimens. This included EC and C4 pads, with intervening vias and redistribution lines, and separate redistribution and signal sheets, and ground planes. In some cases, several extra megohms of resistance occurred. Sometimes this corresponded to known sheet flexing, suggesting incomplete cracks. Using blunt tungsten wire probes without indium balls, I measured conductivity along via columns in a laminated sample. As long as the probes were not driven into the sample, a low power microscope showed no visible damage.

As a result, the modification of the process shown in FIG. 1 was initiated for the purpose of inspecting patterning paste in, on or through green sheets prior to sintering.

Referring more particularly to FIG. 1, a set of green sheets is punched in accordance with a predetermined pattern to produce holes for conductors passing through them, in step A of the prior art process and step A of the modified process. Next, patterning paste employed to produce the conductors in the package is applied as printed patterning paste in a metallic screen printing process, in step B following step A. Next, the green sheets which have been printed with the patterning paste are inspected optically in step C. The modification in the process is shown in step H which follows step C in the new process. Step H involves stacking a number of the green sheets into subsets of the ultimate set of green sheets to be laminated prior to firing. Then the stacked sheets are laminated under considerable pressure to form from the subsets what will be referred to hereinafter as "sublaminates". Then in step I, which follows steps C and H, the electrical test of the instant invention is employed to determine the conductivity of the patterns printed on or in the laminated subsets known as sublaminates. In fact this amounts to a continuity test in the event that the path being tested is completely broken.

Line J leads from step I in FIG. 1 to step D in the prior art process of fabrication of laminated green sheets. In step D the entire set of green sheets from step C or from step H is stacked into the number of sheets from step C or sublaminates from step I which are to be incorporated into the final laminate to be fired. The stacked green sheets or sublaminates are then laminated by pressing in accordance with the state of the art to form the final laminate. Next in step E, the final laminates prepared are sintered to convert the laminated stack into a ceramic tile incorporating conductive material which forms the conductors and vias where the conductor forming patterning paste has been printed upon the surface of green sheets and through holes in the green sheets. Then the tiles are plated in step F. Finally, in step G, the resulting ceramic tiles are electrically inspected in accordance with the state of the art to determine the resistance or the electrical continuity of the newly manufactured conductors and vias in the package.

Several forms of electrical contact or probing with unfired conductive paste have been contemplated in accordance with this invention. Some of them are listed below while others are described in subsequent sections hereof.

Mechanical Contact Methods

1. Individually articulated microprobes in an array.
2. Cats whisker IC probes with ball tips.
3. Conductive sponge.
4. Array of ball contacts on flexible sheet or membrane pressed pneumatically onto green sheet, or ball contacts on a conductive sponge.

Non-mechanical Probe Methods

The following probes can be applied in specimen specific geometry or specimen independent geometry:
1A. E-beam to deposit negative charge directly into target.
1B and 1C. E-beam to detach secondary electrons from target. These secondaries both positively charge target and also indicate its voltage by their number and energy distribution.
1D. E-beam to measure relative target voltage like a vidicon, by whether or not the beam is turned around by the target.
2. Ion beam probe—allows positive flow in complement to negative E-beam. Both may be used in conjunction for an electrically complete circuit. Employ ions having low chemical activity.
3. Pneumatic Ion jet (operative at atmosphere pressure without vacuum).
4. Electrically active optical beam. Photoelectrically detaches electron from target. (See 1B, C above.)

There are different mechanical requirements for testing vias, namely contacts on both sides, than for testing lines, namely both contacts on one side. In some cases one sided contacts can simultaneously test lines and vias when the circuit starts and ends on one side. This is the case for the top most sheet. Also, via testing requires a probe with a well-defined end which does not penetrate down a partially filled via hole to give a positive reading even if there is not a sufficient amount of paste in the hole. This can be done by balls as in 2 and 4 above not by the sponge 3 above or the electron beams above, since they can extend down into the via hole giving a false reading of adequacy of conductive paste in the via. However, if the test can be made on adjacent lines this restriction disappears. Another possibly more serious problem is contact damage to the conductive paste. The electron beam is an excellent solution to this aspect of the problem since there is no mechanical contact.

Commercial integrated circuit testing machines are modified utilizing an array of cats whisker probes carrying the ball tips as described above.

It is also possible to employ low resolution mechanical contact on one side of the green sheet structure and a high resolution electron beam or the like on the other side.

To test vias, one can use a top and bottom line of probes and step across the specimen. To test x-only or y-only lines, the one side of the same probe is adequate to test irregular patterns. One can use a small number of irregularly located probes specialized for the particular layout or else a large universal array.

FIG. 2.1 shows a green sheet sublaminate SL with conductive paste CP and ohmmeter OM with its leads L. A potential break BK is shown in conductive paste CP within the sublaminate SL which cannot be detected by optical inspection. Using the method of this invention in the contact mode, current is passed through the conductive paste from the ohmmeter to determine whether continuity or proper resistance obtains as it should.

FIG. 2.2 shows the alternative of use of a pair of electron beams SB and WB to hit opposite terminals T1 and T2 of conductive paste CP. Beam SB is a strong beam which charges terminal T1. If there is continuity, then there will be a charge at terminal T2 which will be effective upon the weak beam WB and its secondary electrons SE.

FIG. 2.3 shows a second sublaminate SL2 with a conductor of conductive paste CP2 which extends from the top to the bottom of the sublaminate with a break BK2 which may exist in its continuity. Terminal T3 is exposed at the top of the sublaminate for contact as in FIG. 2.1 or in FIG. 2.2 directly with a lead L or directly with a beam SB. The lower terminal of the conductive paste line CP2 is T4 which contacts ground plane GP which has a conductive surface providing a return path to any sensing circuit.

FIG. 2.4 shows a green sheet GS with a conductive paste line CPL printed thereon with a potential break BK3 therein. Ohmmeter OM is connected by leads L to terminals T5 and T6 of line CPL.

Green sheet GS is shown in FIG. 2.5 with a conductive paste pattern CPP to be sensed by ohmmeter OM.

In FIG. 2.6, a sublaminate SL3 with a top terminal T7 has a weak beam WB directed at it for knocking out secondary electrons SE to electrode EL. The potential break BK4 in conductive paste CPS is to be detected. The strong beam SBL is directed from a lower direction up onto the lower surface of the sublaminate SL3 to hit terminal T8.

In FIG. 2.7 sublaminate SL4 incorporates conductive paste conductor CP4 with potential break BK5. Upper terminal T9 of CP4 is tested by E-beam SB2 which is a strong beam charging the line. The lower terminal T10 of line CP4 is connected to a mechanical contact ball MCB which is connected to an output amplifier which passes the current conducted thereto from beam SB2 to the output for processing.

FIG. 3.1 shows a perspective view of an MLC upper level sublaminate SL5 with one of the C4 pads for the solder balls for the chip and one of the fanout pads FP connected by a line of conductive paste CP5 with a break BK6 to be detected by the ohmmeter OM and leads L.

In FIG. 3.2 the same sublaminate SL5 with a strong beam SB3 and a weak beam WB3 directed at the fanout pad FP and C4 respectively, and electrode EL2 arranged to sense the secondary electrons SE from the C4 terminal.

FIG. 4 shows the results of the steps of the prior art process in which a stack of green sheets at the left is laminated by compressing them in accordance with the state of the art. Next, after lamination, they are shown in the form of a full laminate FL. Then they are sintered to form the chip carrier tile CC which is tested to form the tested tile CCT.

Figure 5:
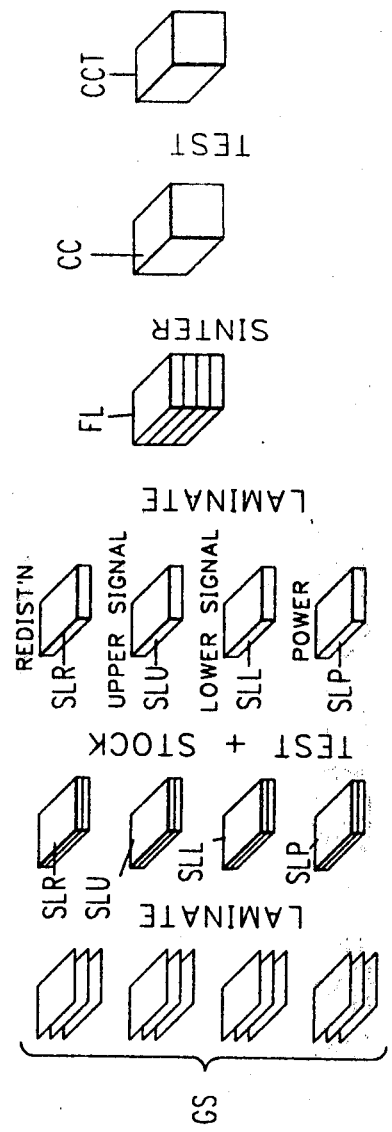
FIG. 5 is an illustration of the process of the instant invention for assembling green sheets into sublaminates, inspecting electrically and firing and reinspection in accordance with the instant invention, with the alignment of the drawing with FIG. 4 intended to facilitate comparison with the prior art process or method of manufacture.

FIG. 5 is below FIG. 4 with the assembly and processing steps aligned below the drawings of the results of the corresponding steps in FIG. 4 for the purpose of facilitating comparison between the two processes in graphic form.

At the left a group of four sets of three green sheets GS is shown. They are previously punched and printed with conductive paste (as were the green sheets in FIG. 4). The four groups of green sheets are laminated individually to form the redistribution sublaminate SLR, the upper signal sublaminate SLU, the lower signal sublaminate SLL and the power sublaminate SLP. Next, the sublaminates are electrically tested in accordance with the instant invention and then they are laminated to form the full laminate FL which is then sintered yielding the chip carrier tile CC.

Then the chip carrier tile CC is tested electrically in accordance with the conventional state of the art method in the industry.

TESTING TECHNIQUE: How should the test probe the specimen? How necessary are probes on both sides of the specimen, with their added complexity? Should the probes be mechanical contacts or electronic beams?

The probes should establish electrical contact quickly and reliably and not damage the specimen. Consider mechanical contact techniques. The unlaminated conductive paste is soft and highly resistive, and requires a conforming conductive tip. An indium ball can be used a few times for a connection before it deforms and must be replaced. A better option would be a tip made of a metal-loaded elastomer, which recovers its shape after pressure. Since the specimen resistance is large, a moderate tip resistance is allowable. The laminated paste is much firmer, and may tolerate a harder conducting tip on a flexible backing. For example, use a resilient 10 mil wire, with a "cat's whisker" bend and a rounded tip, or else individually articulated contacts.

Next consider how to make an array of mechanical contacts. There are many more potential via sites than test points necessary for any one sheet. Therefore we should use an interchangeable array which is matched to the pattern to be tested. Also since there is repetition within some sheets (such as redistribution and power) the array can cover only one "unit cell", and the test can "step and repeat". We could adapt the equipment already developed to test completed MLC tiles, or could use microprobe cards already developed to test IC chips. Alternatively, use a flexible insulating membrane, with many embedded soft metal contact balls, all gently pressed against the specimen by pneumatic pressure. This matches the dense, flat, precise test locations and might be mechanically simpler.

Figure 6:
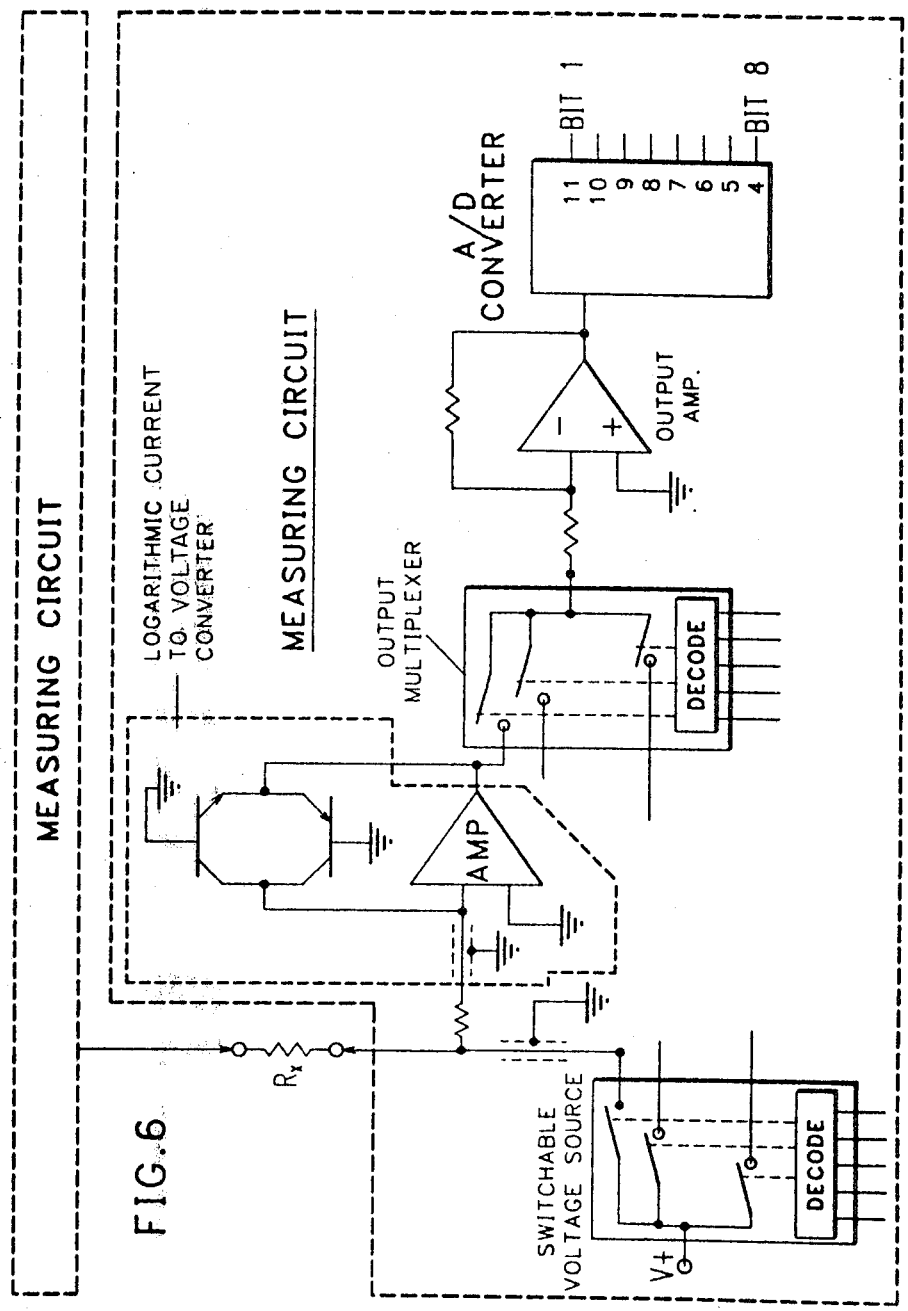
FIG. 6 is an electrical schematic diagram of a circuit employed for the purpose of determining the resistance of patterning paste on green sheets which have been assembled and pressed to form sublaminates. This device is necessary to adapt conventional electrical equipment to measure the high resistances of the patterning paste employed in manufacture of the carrier packages in green, i.e., unfired form. The high impedance and wide dynamic range measured by this circuit contrast with the low impedance measured by circuits for inspecting the finished product.

FIG. 6 shows a bidirectional, high speed, wide range, multichannel logarithmic resistance measuring card adapted for use in connection with an ohmmeter for measuring the resistance of a conductive paste line or via by the direct contact method.

TESTING STAGE: Here we indicate the best stage for testing electrical conductivity. It can be tested on individual green sheets, or on sublaminates (e.g.,: just the top 5 redistribution sheets laminated together) or on full laminates before firing, or on fired but unplated tiles, or on completed, plated tiles. Earlier testing is favored by greater specimen repairability and lower costs for rejected units. Later testing is favored by greater test conclusiveness, and reduced testing effort, and reduced hazard of test-induced damage. Table I summarizes these comparisons.

Note that sublaminate testing is second-best in every dimension; all other tests are worse in at least two dimensions. A sublaminate is the earliest stage where via COLUMN continuity can be tested, and where the specimen is mechanically durable. However, it requires changing production from one lamination stage to two stages, with associated alignment issues. For production of laminates of dozens of sheets to form a full laminate; one laminates several sheets into a sublaminate, then several sublaminates into a full laminate.

Green sheet optical testing appears to be good for detecting short circuits, and fair at detecting broken lines (if the break exceeds an optical resolution threshold) and fair at detecting improperly filled vias (if the via lip is uncovered). It cannot test via COLUMN or via continuity because the sheets are not stacked at this stage. At the other end of production, electrical tests on electroplated, fired tiles is definitive, but it occurs so late that rejects are costly, and repairs are limited. Sublaminate testing seems an appropriate complement to these tests.

Table I compares tests at various stages. It lists the relative test conclusiveness, repair and rejection costs specimen repairability, amount of testing, specimen damageability, and required production changes. The most desirable stage is "A", and successively less desirable stages are "B", "C" . . .

TABLE I

| | STAGE | | | | |
|---|---|---|---|---|---|
| Tile TEST DIMENSION | Green Sheet | Sub Laminate | Full | Unplated Laminate | Plated Tile |
| Conclusiveness | C | B | B | A | A |
| Rejection Cost | A | B | C | D | E |
| Repairability | A | B | C | C | C |
| Amount of Testing | C | B | A | A | A |
| Specimen Damageability | C | B | B | A | A |
| Production Changes | A | B | A | A | A |

Note that sublaminate testing is "B" or second-best in every test dimension. All the other test stages are "C" or worse in at least two test dimensions.

LAMINATES: Assume that MLC product includes several dozen successive green sheets in a full laminate, laminated together but not yet fired. By contrast, a sublaminate is a smaller number of successive green sheets laminated together but not yet fired. When all sublaminates are ready and inspected, then they should be relaminated into a superlaminate.

In particular, it should be useful to fabricate the superlaminate as 3 or 4 sublaminates; e.g., redistribution, power and signal sublaminates.

LOGISTICAL ADVANTAGES: The redistribution and power circuits are fixed. They should be sublaminated soon after screening, then resistively inspected and stored. Sublaminates have much better storage and handling durability than green sheets. The signal circuits are personalized, and vary with the batch. Only the fixed sublaminates should be stocked, then relaminated as soon as each signal batch is ready. Thus one fabricates superlaminates from stocks of known quality, with improved production predictability.

By contrast, without sublamination each layer can be stored as a green sheet until several dozen are available in sufficient quantities for total lamination, being in storage, often up to several months. There are logistical and coordination requirements on production to match stocks of all sheets. These are compounded by the irregular production yield, green sheet damageability and limited shelf life.

YIELD ADVANTAGES: The production process practiced without using sublaminates does not catch those defects which slip through optical inspection until after firing and plating. Then they may degrade an entire MLC module, including all sheets and the subsequent firing and plating effort. Also, there is slow feedback from improper green sheets.

Unfired MLC pattern paste is slightly more conductive than the green sheets. Each sublaminate can be inspected resistively before relamination. Thus a single defective green sheet would degrade at most one sublaminate.

Defects in redistribution or power sheets are generally not repairable, but defects in signal sheets are generally repairable. Redistribution defects can account for about half of all final yield failures. Thus sublaminate fabrication and resistive inspection nicely parallel the pattern of yield losses and repairability. Also, multisheet via column continuity is inspectable at the sublaminate stage.

INSPECTION STRATEGY: Any production inspection must be reliable, and there must be many test points per array. Insofar as contacts miss, they cause false open circuits. Therefore we test sequentially, and test again if the first test shows an open circuit, and take the lowest resistance reading for each test point. If the reliability of a single contact were good, this procedure would converge quickly.

The policy for specimen acceptance, rejection or repair should match the testing technique and production economics. What sublaminate resistances are acceptable? What should be done with a specimen showing some extra resistance due to a partial circuit break? How often do breaks "heal" from green sheets to laminates to firing? Should we test with relatively high current to burn out unreliable "weak links"?

INSPECTION ADVANTAGES: Electrical resistance inspection could be done on green sheets, sub-, super- or full laminates. Green sheets require careful handling, prefer contactless inspection, and require a very high inspection rate. (Perhaps E-beam resistance inspection will make this and via inspection feasible). Laminates of all three types should allow either electromechanical or E-beam resistance inspection, and allow a lower inspection rate.

The compressed paste in laminates has much better conductivity than the uncompressed paste on green sheets. This does not need such high impedance techniques, and hence allows easier electronics and less sensitivity to leakage currents. Also, green sheet contact testing requires many probe geometries. Sublaminates at the indicated points require a few fixed probe geometries.

In addition, the redistribution and power sublaminates present lower resistances for inspection than long narrow signal lines. Again, lower resistances make resistive inspection easier. Thus the circuits which are hardest to inspect resistively are isolated in the generally repairable part.

With minor changes, the same inspection equipment can inspect present full laminates and sub- and superlaminates. This compatability allows flexibility in coordinating implementation of sublamination and resistive inspection. Furthermore, resistive inspection of laminates could largely adopt the mechanical systems already implemented for final electrical inspection.

A sublaminate is mechanically like hard shoeleather. The top-most surface presents numerous chip sites each with many dozens of C4 terminals and EC terminals. The densest spacing is the center to center square grid of C4 terminals. The bottom-most surface metallurgy presents many hundreds of widely spaced terminal pads. Other sublaminate surfaces present various other patterns, but presents vias only a few mils in diameter as terminal pads. Sublaminate paste circuit resistances are much higher than fired paste resistances. Measurement speeds should be faster than one second per chip site. This requires open and short tests between several hundred terminals.

Laboratory tests for resistive defects can be made with micromanipulators with flexible probe tips and a high range ohmmeter. A preferred system uses a commercial IC probe station with flexible rounded tips, to probe about 16 terminals in one chip site which is stepped over an MLC specimen. The output of the sensor passes to a 16-channel, wide dynamic range, high resistance measuring, front-end card with driver and readout boxes to operate this card. (See FIG. 6)

Adequate laboratory measurements require full chip site capability. Therefore, we need a buckling-beam probe head, with hundreds of contacts. The probe is mounted in a drill-press-like arm, with an XY feed for moving the specimen, and a number of front-end cards and a microcomputer system to drive and to read them.

A non-damaging probe head will require features such as a printed circuit with raised conductive buttons or else a buckling-beam array with reduced contact pressure and rounded tips, or else a stiff head with an anisotropically conducting elastomeric sheet cushioning the specimen terminals. The electronics comprises a front-end card, with provisions for both two-point continuity and ganged shorts testing. The sequence driver and readout are semiautomated at a microcomputer level.

A multipoint probe contacts the EC and C4 terminals in one chip site on the top-most TSM layer of the redistribution sublaminate. Another multipoint probe contacts the vias on the bottom of one chip site of a redistribution sublaminate. Third are larger multipoint probes for the top and bottom of the power sublaminate. One contacts large terminal pads, but the other contacts small vias again. Redistribution and power sublaminates have fixed schematics and can use relatively fixed testing programs. The signal sublaminate is personalized, which makes its probe heads and testing program more complex. Also most defects here are effectively repairable.

PC PROBEHEADS: Contact electrical inspection of multilayer ceramic unfired sublaminates (MLC USBL) requires a probe head with many densely spaced contacts. The densest part of the pattern is the IC footprint array of C4 pads. One attractive possibility is a printed circuit (PC) probe head. This could provide contacts, a space transformer, and a cable connector as follows. At each contact location the PC carries a small raised metal "button". The dense array of buttons is connected by a PC "space transformer" fan-out pattern to a lower density output array. This is attached to a multipin connector, and hence connected to the testing equipment.

MECHANICS: The probehead must reliably contact the leathery MLC USBL without excessively damaging the specimen. Although an ideal specimen is planar, the actual specimens may be somewhat bent. What contact mechanics are needed? The contact buttons should be short, preferably blunt, and apply a limited pressure. The PC sheet itself could be dimpled under each button for local spring action. Different PC mountings can be used to compensate for the nonplanar specimens. A rigid PC mounting can force the specimen into an easily contacted plane. Alternatively, a flexible PC sheet can conform to the specimen by using a spongy backing plate, or by using a drumhead mounting with compressed air backing. An especially elastic PC uses an extra thin PC sheet, or uses small pleats (or creases or waves) in this sheet, or uses tiny cuts in this sheet.

The TFM is a very high density flexible printed circuit, typically sputtered thin copper on a thin polyimide film.

TFM technology provides an inexpensive, high density, flexible printed circuit which fans out from an IC footprint to multiple connections to a multipin connector. Deliberate crinkling of the TFM provides extra elasticity. The contact buttons could be either previously developed solder balls or else plated micropins. The TFM technology even provides a multilayer flexible PC, which can ease the fan-out geometry.

CRITICAL PARAMETERS: The C4 array contains many contact sites inside a perimeter of inter-via spaces. The MLC USBL resistances are much larger than fired circuit values. Therefore probe head resistance is not critical, and does not restrict the line cross section. If fan-out density turns out to be critical, one can use a two-layer TFM PC.

OTHER APPLICATIONS: Some electrical inspection machines use buckling beam probe heads which are difficult to fabricate. A TFM PC probe head is an attractive alternative. Multilayer TFM PCs allow probing high density versions of MLC. Related designs are useful for probing semiconductor wafers. More generally high density printed circuits are improved space transformers (fan-out devices) for many electrical probing systems.

Scanning electron microscopes (SEMs) have been used to probe voltages on operating ICs. The beam is nearly stopped by a deaccelerating grid just in front of the specimen, and the local specimen voltage can influence the beam. A continuity test uses two beams, or one rapidly multiplexed beam, to apply charge at one end of a specimen conductor, and to measure the voltage at the other end. Electron and ion beams are both used to apply both positive and negative beam currents. Vacuum outgassing will not harm a sublaminate specimen, and differential pumping prevents this gas from degrading the SEM operation.

INTRODUCTION: New technologies allow electronic modules with more circuits in smaller packages. These require new electronic testing methods. One promising technique is to "wire up" a module and to probe it with a scanning electron microscope (SEM) as it operates. Thus one can inject charge or measure voltage (via secondary electron energy) at any desired location and time. This technique enjoys the excellent spatial and temporal resolution of SEMs, and the flexibility of an electronically steerable, functional probe.

This technique is inadequate for specimens which lack external electronic connections to complete the current path for the E-beam probe. Even if there are a few such connections, some measurements require numerous flexible connections for a pattern of two-point electrical measurements. An example is electrical continuity testing of terminals of an incomplete high-density printed-circuit-like module. The open/short testing requires probing an arbitrary pair of terminals. However the module is too incomplete to have any external connections. Also so many external hardwired connections are inconvenient.

OVERVIEW: A novel improvement is to use multiple electronically active beams for probing multiple terminals of each circuit. These beams can be electrons, ions, or light. They can be physically distinct beams or a single beam multiplexed between multiple terminals. For example, an E-beam can measure voltage at one terminal while multiplexed with an E-beam which injects charge at another terminal. This can test for the intervening circuit parameters such as continuity or discontinuity, resistance, capacity, or inductance. The electronic beam steerability of both probes allows the flexibility required for testing the incomplete module described above.

It is useful to make probes which separate electronic measurement from electronic stimulation. Within each class, it is useful to separate charge-defined, current-defined and voltage-defined probes. Therefore, the multiple beams can differ in duration, intensity, voltage or composition. Also the apparatus and electrodes in the specimen chamber near the specimen can vary in voltage or geometry.

Sometimes it is necessary to contact many terminals at once, such as discharging the overall specimen to ground prior to charge-voltage measurements. Then broad sprays of low-voltage electrons, ions or UV light tend to globally equalize the specimen voltage.

ONE MULTIPLEXED BEAM: A vector electron microscope (VEM) can rapidly multiplex the beam between multiple terminals to effectively create multiple probes. Suppose for concreteness that we want to test circuit continuity in the modules described above. Initially discharge the specimen as described in a later section. Then steer the beam to the first terminal and apply a low-current beam to excite secondary electrons. Measure their energy distribution with an appropriate electron spectrometer. This distribution will be shifted by the voltage difference between the terminal and the electron spectrometer, and by the local specimen's work function. Next, aim the beam at the second terminal, and inject charge with a relatively intense and/or prolonged beam. Finally, steer back to the first terminal and remeasure its voltage by the energy distribution of the secondary electrons. The difference between the two measurements indicates the degree of conductivity between the two terminals. The measurement can determine various circuit parameters by the size of the voltage change (compared to the injected charge) and by its time dependence. Time measurements do not require current and voltage absolute calibration and may be particularly convenient. Clearly, the voltage measuring time and the beam steering time both limit the smallest circuit RC value which can be distinguished from zero. The measurement signal/ noise can be improved by operating with voltage changes which are large compared to the intrinsic spread in secondary electron energies.

PHYSICALLY DISTINCT BEAMS AND STEADY STATE MEASUREMENTS: There are many applications where multiple physically distinct beams are preferable to a multiplexed single beam. This in turn allows several new measuring and probing techniques.

Some specimens have terminals on two opposite sides. These require at least two beams, one on each side. Some measurements require multiple different beam types, such as negative electrons and positive ions, or high and low kinetic energy electrons, or electrons and UV light. These also require distinct beams.

Certain applications require steady-state measurements and hence steady distinct beams. An important example is a DC equilibrium measurement, such as one of the preceding probe pairs providing counterbalancing positive and negative currents. AC steady-state measurements can be made by modulating one or more of the beams. Of course there is a DC offset in these unipolar AC measurements.

VARIOUS PROBE TYPES: Standard electronic techniques include well-regulated voltage and current sources and high impedance voltmeters and low impedance ammeters. A corresponding variety of electronically active beams is useful.

Figure 10:
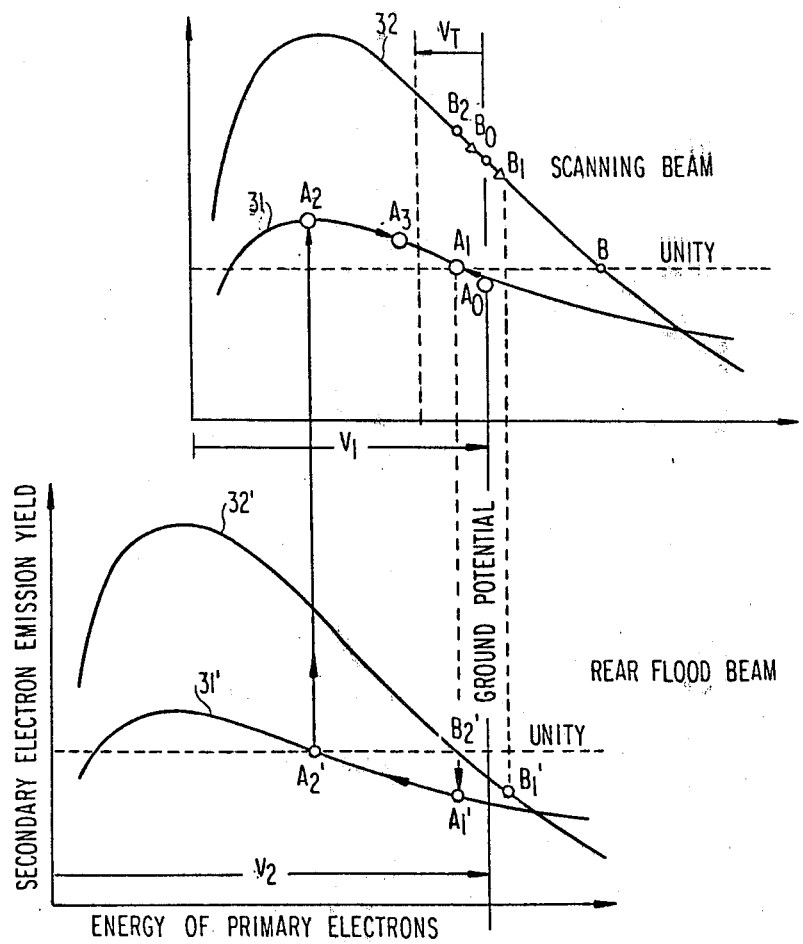
FIG. 10 is a graph showing secondary emission yield curves for typical materials to be inspected.

Electrons are the most traditional beam. At sufficiently high beam voltages compared to the local specimen voltage (typically more than a few keV) there is relatively little secondary emission and there is a net negatively-charged current-defined source. At intermediate beam voltages (typically down to tens of volts) the secondary electron emission exceeds the primary electron absorption, and there is a net positively-charged current-defined source. At still lower beam voltages there is again little secondary electron emission and a net negatively-charged current-defined source. Note that at certain beam voltages there is cancellation between the primary and secondary currents, and zero net current flow (FIG. 10).

One voltage measuring technique is to compare electrostatically the specimen voltage and the beam total energy. If the specimen is more negative, then the beam will be repelled. If the specimen is more positive, then the beam will reach the specimen. These two conditions can be distinguished by detecting the presence or absence of secondary electrons, or by detecting the absence or presence of electrostatically repelled high energy electrons.

This voltage measurement often will require changing the beam total energy. One way is to change the electron column voltage, but this interacts with the beam optics. Another way is to add auxillary electrodes downstream of most of the beam optics, and to apply a voltage to modulate the net beam energy.

A related technique gives a voltage-defined source. The preceding discussion of net current versus beam voltage can be reinterpreted as net current versus specimen voltage for a fixed beam energy. At the cancellation points there is zero net current flow. In some cases there is net positive current flow for more negative specimen voltages and net negative current flow for more positive specimen voltages. The net current flow can change the local specimen voltage. Therefore, there is a negative feedback cycle whose equilibrium forms a voltage-defined source. This equilibrium can also be shifted by biasing electrodes near the specimen to change the external electrical fields seen by the secondaries.

In some cases it may be desirable to shield the rest of the specimen from the secondary electrons, particularily the relatively numerous low energy secondaries. These can be swept away to a collector electrode by a relatively weak electrical field. This may also be a secondary electron detector or energy analyzer. An additional shielding technique is to apply a weak magnetic field parallel to the beam direction. This traps the low energy secondary in helical paths which carry them away from the specimen to a collector. Since the magnetic field is weak and is parallel to the beam, it will have relatively little effect on the beam optics.

The secondary electrons provide another voltage measuring technique. Their energy distribution will be displaced by the local specimen voltage. Therefore measuring the secondary electron energy can determine the local specimen voltage. The secondary energy measurement can range from an electron spectrometer to a detector with an electron energy window.

To make a high impedance voltmeter, we can use a highly efficient secondary electron collector and a sensitive electron detector. However, there are practical and theoretical limits to the attainable voltmeter impedance and response time. A different approach is to operate at a beam energy so that the primary and secondary currents cancel. Thus a high impedance voltage measurement can nevertheless operate with a large secondary current and partly bypass these limits.

There are other ways to distinguish voltage measurement and current injection. In some applications, the test is only to distinguish connected and disconnected circuits. If the specimen does not impose a canonical voltage or current scale, then these can be chosen to optimize testing. Therefore one should use an intense beam to inject charge and a feeble beam to measure voltage.

BACK-GOING PARTICLE TYPES: There are many types of particles which can be used for these measurements in place of "secondary electrons". First are backscattered primary electrons, such as those which recoil from a head-on elastic collision with a nucleus. Also primary electrons can be electrostatically turned around by the local specimen voltage. These two types can produce back-going electrons with energies comparable to the beam energy.

Secondary electrons are next. They can be knocked out by a backscattered primary electron as it leaves the specimen. Also they can be struck by the primary and rescatter until they diffuse out of the specimen. In addition, there are tertiary electrons knocked out by secondary electrons. These types can have a wide range of energies.

Next are electrons emitted by deexcitation of upper quantum states pumped by previous electrons. These electrons have a relatively narrow energy spread, are relatively numerous, and are particularly useful for comparative voltage measurement.

These specimen electrons will have an energy distribution which depends on the local specimen work function and material. This will be insignificant in measuring large voltages, will cancel out in measuring voltage changes at one point, or can be corrected for after measurement if the local material and work function are known.

Finally there are X-rays and photons excited by the electrons. Since these are neutral, they indicate the arrival of the primary beam energy, but are not accelerated by the specimen voltage, and are not effected by the work function and surface effects.

NON-ELECTRON BEAMS: Light, particularily in the UV or far UV, provides another family of probes. There is a secondary electron emission which depends on the local specimen work function and the voltage difference between the inside of the specimen and the nearby vacuum, and on the photoelectric coefficient. Near equilibrium this forms a voltage-defined source, analogous to the electron beam case discussed above. The equilibrium voltage can be adjusted by biasing electrodes near the specimen, and/or by changing the photon energy. To clamp a specimen at a fixed voltage, locally apply an excess light flux. To make a low impedance ampmeter, also collect a well-defined part of the secondary electrons.

One particularly convenient two-beam system uses a light beam and an electron or ion beam. Note that the light is not directly effected by the electrical and magnetic fields which control the charged beam. The light can be focused and aimed by an independent lense or mirror system. Thus an electron beam system can become a two-beam system by adding just an optical window to the vacuum chamber and an outboard optical system.

A third family of probes uses ion beams. In many ways these are similar to electron beams, but always apply a net positive current to the specimen. They can be useful to apply a positive current which does not depend strongly on the precise secondary emission ratio. One application is a low-energy ion spray to neutralize negative charges on the specimen, and another is a positive current source. Another potential virtue is a different voltage-secondary emission characteristic.

Noble gas ions, especially helium, are useful. First, they cause relatively little chemical interaction with the specimen. Second, after they are stopped and neutralized, they can diffuse out quite readily. Thus one can avoid unwanted ion implantation.

HARDWIRED CONTACT: For certain applications, some hardwired connections are desirable. Active electrical assemblies, such as integrated circuits, require various power, biasing, and signal connections. These can be supplied by a few hardwired contacts, while beams supply more versatile probing.

DISCHARGING SPECIMENS: The preceding voltage-defined sources can discharge specimens. If it is desirable to discharge a broad area on a specimen, then one can use a broad flood of light or ions or electrons.

Figure 8:
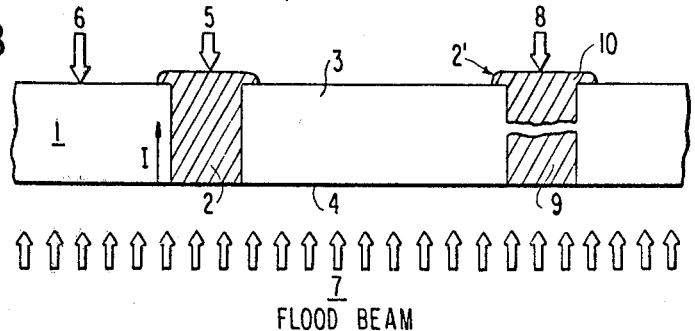
FIG. 8 shows a section of a specimen being inspected in the apparatus of FIG. 9.

Referring now to FIG. 8, a schematic diagram illustrates the typical structure of a specimen under consideration for test. A matrix 1, formed of a dielectric material, may be a single green sheet, a laminate comprising a number of green sheets defining a sublaminate structure, or a complete multi-layer ceramic laminate. The matrix of dielectric material contains a number of conducting elements 2 which normally extend from the front surface 3 through the layer to the rear surface 4. An important defect found in these specimens is an "open" condition in the conductor 2' wherein a break occurs dividing the conductor into an upper part 10 and a lower part 9. Discriminating between continuity existing in conductor 2 and an open condition existing in conductor 2' is achieved with this apparatus.

FIG. 8 shows the application of a scanning electron beam used as a probe in the measurement of electrical properties of the specimen. As indicated, SEM technology, as a scanning beam per se, has been employed within the prior art. A second beam, flood beam 7, is positioned relative to the rear surface 4. The scanning beam on the front surface 3 is utilized in a typical SEM fashion to read out a signal from various locations on the specimen. These regions are indicated by areas 5, 6 and 8.

The rear flood beam 7 has an energy level different than the SEM beam on the front surface. Typically the rear flood beam may have a high energy level. The system however operates at energy levels, about 2 kV, that are considerably lower than conventional SEM operations. Where the specimen has a thru connection, that is, an intact via, such as contact 2, the electrical potential which results from charging by the rear electrons is also maintained on the front surface due to ohmic conduction. This potential is more negative than that which exists in the case of an open via (conductor 2') where a break occurs denoting an open via 9, 10. The potential is also more negative than that existing within the matrix 1, giving rise to a higher level signal which appears as a bright point on a video screen. The generation of the contrast mechanism, especially the generation of the negative potential, involves secondary electron emission and will be described in more detail herein.

As shown in FIG. 8, the test location on the specimen 1 is determined by the scanning beam focused at different discrete regions. However, on the rear side, a broad angle, non-steered beam is used and is produced by a so-called flood gun. Flood beam electrons indicated as elements 7 in FIG. 1 in place of a steered beam allow for a simpler system. Flood guns per se are well known in CRT and storage tube devices. Typical guns capable of wide angle emission to allow dispersion to the entire rear side of the specimen can be used.

The flood beam emerging from flood gun 11 can be spread into two still wider angles by placing an electron lens, magnetic or electric between the flood gun and the rear of the target. This lens is excited such that the focal length is short when compared to the distance of the lens to the target.

Figure 9:
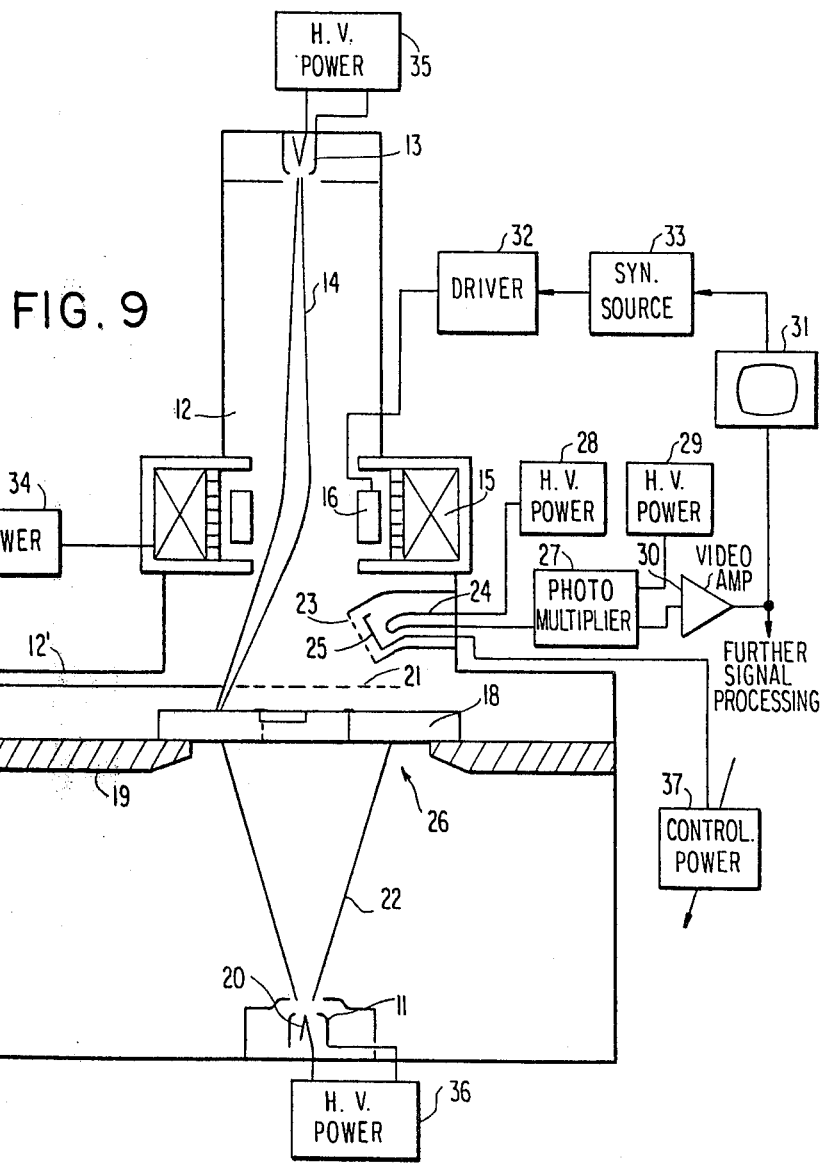
FIG. 9 shows an electron beam inspection system adapted to perform electrical inspection in accordance with the instant invention.

Referring now to FIG. 9, a schematic of an overall E-beam apparatus used to practice this invention is shown. The specimen under test 18 is positioned on a support frame 19. Positioned above the specimen is a scanning electron microscope column 12 positioned integrally with a specimen chamber 12'. The column 12 and chamber 12' are evacuated. The electron gun 13 is positioned at one end of the optical column 12 and emits an electron beam 14. The beam 14 is demagnified and focused by means of a lens 15 comprising a number of focusing coils. The lens mechanism 15 functions to demagnify and focus the crossover in the gun onto the surface of the specimen 18. Electron beam 14 is also deflected, that is, steered, by means of a deflection yoke 16 preferably located within the lens 15 and comprising a second series of coils. It is understood that the yoke 16 may be positioned outside the lens 15. If necessary, a second lens may be added to enhance beam focus before deflection takes place. Such electron beam focusing and steering is known in large scale integrated circuit lithography. Typical systems are reported in the literature, see H. C. Pfeiffer, "New Imaging and Deflection Concept for Probe Forming Microfabrication Systems", J. Vac. Sci. Technol., Vol. 12, p. 1170 (1975). These devices permit resolution for a given field size and working distance from the gun 13 to the specimen. An extraction grid 21 is disposed over the surface of the specimen 18.

A detector 24 for secondary electron emission is located relative to the specimen 18 within the optical column 2 so that it does not impede electron beam deflection. The detector, however, is located where it can be reached by electrons for every position of the specimen surface within the deflection field of the beam 14. Such detectors are well known in SEM technology. While one detector is illustrated, it is understood that multiple detectors positioned proximate to the scan field may be employed. A retarding electrode 25, located behind an entrance mesh 23, discriminates between electrons of different energies. This technique is also well known in SEM technology to produce a so-called "voltage contrast". The change in secondary electron emission imposed by charging or discharging electrons is detected as a strong voltage contrast which allows clear discrimination between open or continuity conditions. Reports in the literature of suitable detectors and electronics are found in Everhart and Thornley, "Wide-Band Detector for Micro-Microampere Low Energy Electron Currents", J. Sci. Instrum. 37 (1960) pp. 246-248.

As shown in FIG. 9, a flood gun 20 is arranged at the rear of the specimen 18. It produces a wide angle beam 22 irradiating the entire rear surface of the specimen through a sufficiently large window 26 in the support frame 19, to charge the specimen. In order to irradiate large areas or the whole of the specimen without requiring a large distance between flood gun 11 and the specimen, an electron lens may be used in front of the flood gun which magnifies the angle of the beam.

FIG. 9 also includes the electronic power supplies, signal generators and amplifiers to operate the electron beam column. Part of the secondary electron detector is a photomultiplier tube 27 with associated high voltage supply 29. The output signal is amplified by a video amplifier 30 and either processed further and/or displayed on a monitor 31. The secondary electron detector requires still another high voltage power supply 28 to provide an acceleration potential for the scintillation detector 24. The deflection yoke 16 is driven by signals provided by the driver 32. A synchronization source 33 synchronizes the beam deflection and the TV display 31.

A further power supply 34 is necessary to excite the projection lens 15 and an additional lens if necessary. Boxes 35 and 36 denote high voltage power supplies for electron guns 11 and 13, respectively. Additional controllable power supplies 37 and 38 are incorporated to permit the voltages at the retarding electrode 25 and the extraction grid 21 to be set. Each of the ancillary units identified above are known individually in the art.

Beam scanning using the driver 32 and synchronization source may be either a conventional raster scan or a vector scan. In the latter case, the beam would be directed to specific predetermined locations, i.e., points 5 in FIG. 8 to irradiate only the conductor vias.

By choice of operating parameters, acceleration potentials and currents to the electron guns, dwell time of the scanning beam, and the threshold potential of the secondary electron detector, discrimination by means of the generated signal can be utilized to determine electrical conduction of the vias in the specimen. During scanning, secondary electrons are generated in the scanned areas, charged by the flood guns. Determinations can be made ranging from acceptable levels of bulk conduction to the existence of an open condition, that is, complete interruption. The system operates without any physical electrical contact to the specimen 18. This is accomplished by having the signal generated by the secondary and back-scattered electrons picked up by the detector 24. The energy of these electrons must be high enough to overcome the threshold potential which is applied to the retarding grid 25 and the output is employed, for example to modulate a CRT display 31. In an automatic test system, further processing of the output would take place. A computer is employed for on-line processing of the specimen and directs column operations including scanning to provide the coordinates of any defect location in the specimen.

Referring now to FIG. 10, the technique of controlling the electrical potential on the specimen by the flood gun beam is presented. Control is accomplished so that the energy of the secondary electrons emitted from the different elements on the specimen surface provide an unambiguous indicator of continuity or open circuit conditions from the front of the specimen to the rear. FIG. 10 shows secondary emission yield curves showing the ratio between the numbers of secondary and primary electrons. The yield curves 31, 31' and 32, 32' are typical for materials employed in these elements. These curves qualitatively illustrate the relationship between the materials at unity values well known in the literature. Curves 31, 31' represent molybdenum typically used in the paste for the conductor and curves 32, 32' are for a typical insulator such as $Al_2O_3$ which is used in the green sheet material. The upper set of curves 31, 32 are referenced to the acceleration potential $V_1$ of the scanning beam and the lower set of curves 31', 32' are referenced to the acceleration potential $V_2$ of the rear flood beam. Details on secondary electron emission and yield curves are well known in this technology and are referenced, for example, in Kollath, "Sekundarelektronen-Emission Fester Korper Bei Bestrahlung mit Elektronen," in *Encycl. of Phys.*, Vol. 21, 1956, pp. 232-303.

A crucial aspect of the curves shown in FIG. 10 is the energy of the primary electrons at the so-called "second cross-over point". These are shown in the upper set of curves at points $A_1$ and B. At this energy, the secondary electron emission yield is unity. Accordingly, if the target under electron bombardment is insulated or itself is an insulator, charging which occurs due to the difference between the primary electron beam current and the secondary electron emission current results in a shift of the surface potential toward this second cross-over point. This occurs because at the cross-over points, the difference is zero.

These points of unity yield ($A_1$, B) are stable potential points. If the environment collecting the secondary electrons is at a lower potential than that associated with the second cross-over point, this potential of the environment substitutes for the second cross-over point as a stable equilibrium potential.

As shown, FIG. 10 shows curves referenced to the acceleration potential $V_1$ of the gun 13 which produce the scanning beam 14. The curves 31 and 32 pertain to the front surface 3 of the specimen 18. The energy of the lower set of curves 31' and 32' is referenced to the acceleration potential $V_2$ of the flood gun 20 producing the wide angle beam 12. The curves 31' and 32' therefore pertain to the rear surface 4 of the specimen 18. FIG. 10 also shows a common reference of both curves as ground potential.

Under test conditions, initially the front and rear surface are at ground potential and the flood gun is turned off. The acceleration potential of the scanning beam gun 13 is chosen to be close to the second cross-over point $A_1$ of the conductor. This initial point is shown in FIG. 3 as $A_0$. The acceleration potential $V_1$ can also be slightly below $A_1$ but should always be closer to $A_1$ than to unity point B.

FIG. 10 shows point $B_0$ as a point on the curve 32 corresponding to the primary electron energy. During scanning, that is, from position 5 to position 8 in FIG. 8, a shift in potential occurs from point $A_0$ to $A_1$. This is shown by the right arrowhead on curve 31. Similarly, scanning over the dielectric surface, shown as position 6 in FIG. 8, shifts the potential toward B. However, due to the potential of the environment, that is, the extraction grid 21, only point $B_1$ may be reached.

In the case of direct coupling, that is, conduction shown as via 2, or capacitive coupling shown in an open condition due to broken via 9, 20 or from rear to front surface through the matrix, the potential on the rear surface will be exactly or approximately the same. Consequently, in the energy scale of the flood gun shown in the lower set of curves in FIG. 10, point $A_1$ becomes point $A_1'$ and point $B_1$ becomes $B_1'$.

The acceleration potential $V_2$ of the rear flood beam is chosen to be typically several hundred volts higher than $V_1$. Accordingly, when the flood gun is turned on, flood gun electrons, elements 7 in FIG. 8, charge the surfaces of the conducting elements 2 and 9 such that the second cross-over point $A_2'$ is attained. Also, the rear matrix surface 4 in FIG. 8 is charged so that its second cross-over point $B_2'$ is also reached. So long as the scanning beam is absent, the front surface assumes exactly or approximately the same potential. It assumes exactly the same potential in the case of a thru connection shown as element 2 in FIG. 8 or approximately the same potential in the case of a capacitive coupling across surfaces 3–4 or open condition 9–10. This is indicated by points $A_2$ and $B_2$ in the upper set of curves.

The instant when the scanning beam from gun 12 impinges a position, secondary electron emission occurs at that point. At the same time, the scanning beam discharges and shifts the potentials in the positive direction. As shown in FIG. 10, a threshold potential $V_T$ is chosen such that the secondary electrons from the conducting surfaces which are more negative ($A_2$) than the matrix surface ($B_2$) are detected. However, the secondary electrons from the matrix surface are not detected.

Where a thru connection exists, that is an intact via 2, discharging by the scanning beam occurs as a function of charging by the rear flood gun electrons. Hence, the potential shifts toward point $A_3$ as shown by the solid arrow on curve 31 in FIG. 10. It, however, remains below the threshold potential $V_T$.

In contrast, at points of interruptions, such as open condition 9–10, the scanning beam rapidly discharges and a potential rapidly exceeds the threshold potential $V_T$. No more secondary electrons emitted from these locations are detected. By this technique, thru connections can be distinguished from an open condition. A positive indication of these two circuit conditions can be attained.

By carefully adjusting the currents of the flood beam 12 and the scanning beam 14, together with the scanning speed, the signal becomes a continuous function of the resistance of the thru connection. The higher the resistance, the faster the potential is shifted to exceed the threshold potential $V_T$ by the discharging action of the scanning beam during its dwell on the surface of the element under test. This results in a smaller integrated signal occurring in the secondary electron detector. The output of the detector can be displayed on a monitor to view the pattern of secondary electron emission. Defective modules can then be reviewed as scanning takes place and those having defects can be discarded. In an automatic system, computer control of input and output of specimens would occur, coupled with a printout providing a listing of those specimens tested and the defects found.

Accordingly, the system in accordance with this invention allows for non-contact testing of green sheet material utilizing two beams. In essence, "writing" occurs with the flood beam directed to the rear of the specimen and "reading" occurs utilizing the scan beam. This technique is directly opposite to conventional storage tube systems. In those systems, the high energy beam is used for writing and a low energy flood gun is used to maintain a uniform charge level.

Referring now to FIGS. 11–14, another SEM system adapted for use in practicing this invention is shown. An electron beam vacuum column 110 has an electron beam probe gun 112 disposed at one end thereof. A focusing lens system 114 comprising annular coils is used to focus the beam emanating from probe gun 112. Deflection coils 116, driven by a deflection generator 118, are used for beam steering. The electron optics are similar to those of scanning electron microscope systems, well known in the technology.

A processing vacuum chamber 120 has a load lock 122 with a lock port 124 to automatically handle specimens for test. A loading mechanism 126 is used to receive specimens that are mounted on carriers at load lock 122 and move them to transfer table 130. By means of mechanical pushers, air techniques and the like, specimens are moved from the transfer table 130 onto the specimen table 132. The table 132 is selectively movable in the X-Y direction perpendicular to the axis of beam 112 to position predetermined portions of the specimen within the beam deflection field. The table 132 has a port 134 large enough to expose the bottom side of specimen 136. The specimens, once testing is complete, are then transferred in a reverse manner back to the load lock such that when lock port 124 is raised, those specimens previously tested are removed from the chamber 120 and new specimens to be tested are introduced. Loading, unloading and table movement is controlled by system controller 138 providing instructions to the specimen handling controller 140. Electronic control of transfer movement and port access in a manner coordinated with the overall test procedure is well known in this technology. Such techniques are also well known in semiconductor lithography. The specific aspects of system controller 138 and load/unload/table controller 140 form no part of the present invention.

The present invention departs from FIGS. 8–10 by utilizing a pair of flood guns, upper flood gun 42 and lower flood gun 44. Guns 42 and 44 are selectively actuated in a manner to be described herein to charge the respective top and bottom surfaces of the specimen 36 during various test procedures. As will be described herein, other beam arrangements may be employed.

Disposed within column 10 is a secondary electron detector 45. Secondary electron emission is a result of scanning by the probe or "read" beam from gun 12 and is detected by detector 45 providing an output signal to processor 46. The output signal, converted to digital form, is provided to the system controller 38 for purposes of defect detection, and can be displayed and/or stored on a real time monitor (not shown).

Figure 11:
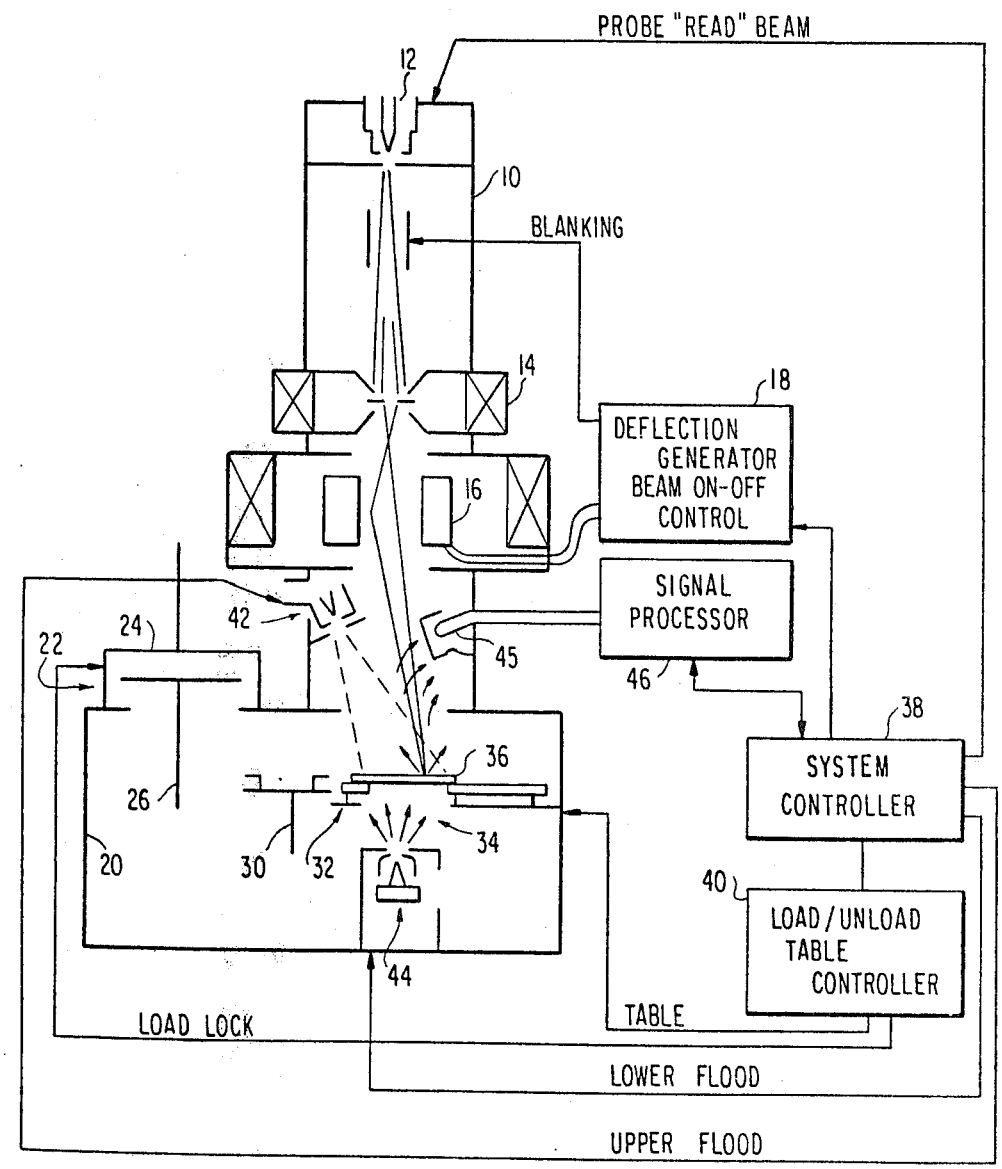
FIG. 11 is an alternative SEM electron beam system for use in accordance with this invention.
Figure 12:
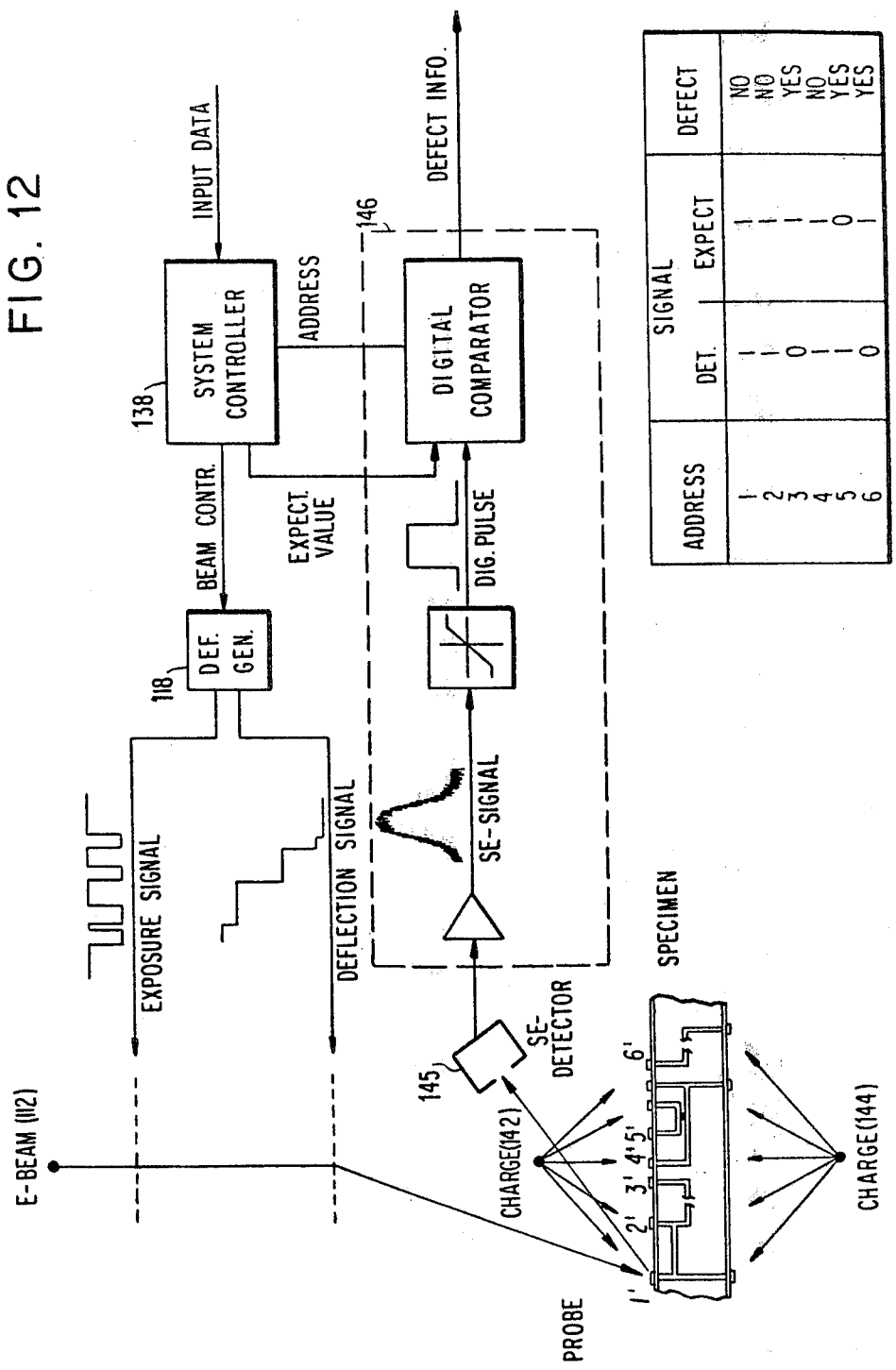
FIG. 12 is a block diagram showing the principle of defect detection in connection with FIGS. 11, 13 and 14.

Referring now to FIG. 12, operation of the system shown in FIG. 11 is illustrated. The specimen shown for testing has six address locations of interest on the top surface. Some, such as end points 1', 4' and 6' have wiring patterns running from the top surface through to the bottom surface. Others such as end points 2', 3' and 5' have only top-to-top connections.

Input data is supplied to the system controller 138 providing the addresses of the specimen points to the tested and the expected outputs if electrical continuity is present. The controller 138 provides signals to the deflection generator and beam on-off control to control the exposure (on-off) and the deflection (beam steering) of the probe or "read" beam. As shown in FIG. 11, the system controller 138 determines which of the flood guns 142 or 144 will be actuated and in the proper sequence with the E-beam. Such controller functions are well known in the lithography art.

In a manner to be fully described herein, either flood gun 142 or 144 is activated to charge one surface of the specimen and then it may or may not be turned off. The "read" beam is then stepped across the specimen to the addresses supplied by the controller. The "read" beam causes the generation of secondary electrons from the surface of the specimen which are sensed by the secondary electron detector 145. The output is amplified, digitized and compared in the signal processor 146.

Comparison of actual digital pulses with expected values takes place for each address scanned. The comparison provides the results shown in the table in FIG. 12 for the specimen shown under top-to-bottom test. Point 1' continuity with the bottom surface is intact, hence no defect. Top-to-top continuity with point 2' also exists. However, an open exists between top-to-top points 2' and 3', hence, the detected signal expected at point 3' is not present given the open circuit. Also, an open is detected at point 6' since, as shown, no top-to-bottom continuity is present. Finally, FIG. 12 shows a short between points 4' and 5' that is detected when point 5' is scanned. Hence, the expected "0" is not present.

Figure 7:
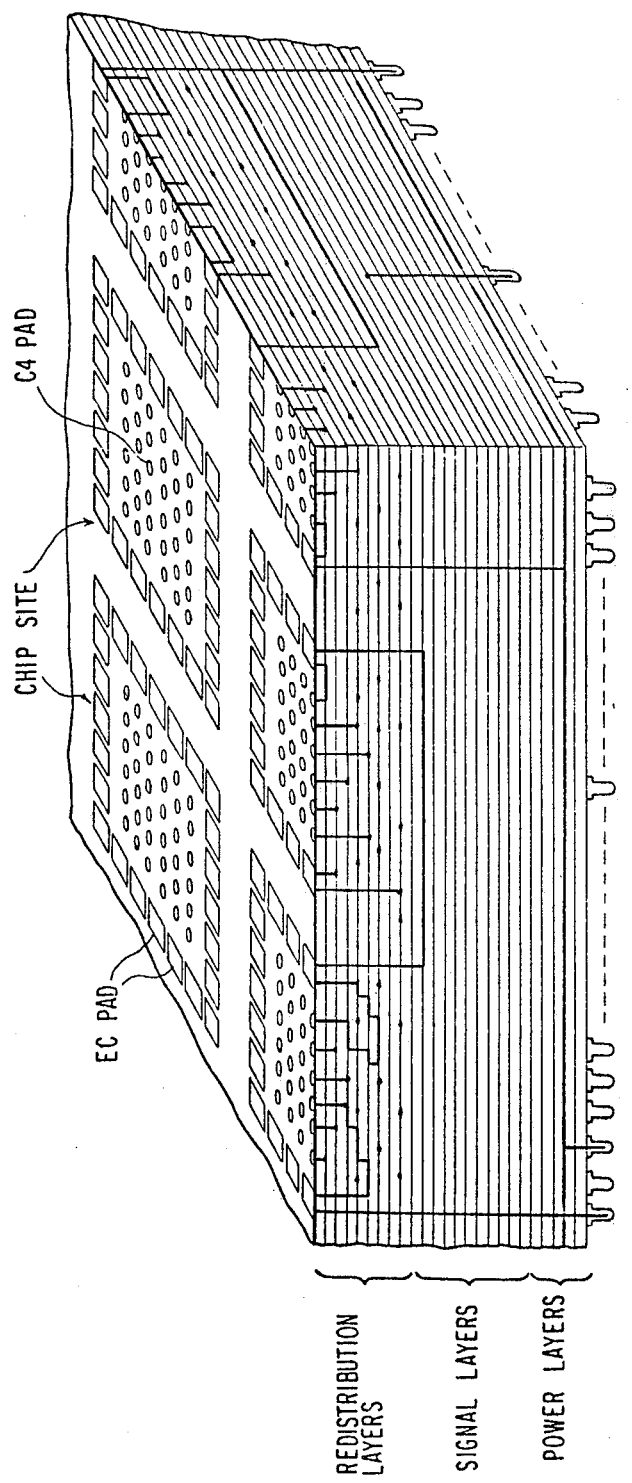
FIG. 7 is an isometric representation of the kind of package manufactured by the process of the instant invention. It is sectioned in order that the conductors can be seen with clarity. For that reason, shading of the insulating material which surrounds most of the conductors has been omitted for convenience of illustration.

Accordingly, as shown in FIGS. 7 and 12, typical green sheets, signal and power sublaminates, and laminates, contain wiring that can span the entire multi-chip region of the sample. Such samples can be scanned one chip area at a time, all at once, or with some other subdivision of the product area. The specific methodology for testing such complex structures, without contact will now be described.

The specimen is loaded onto a table 132 using handling devices 126 and 130 to effectuate transfer from the load lock 122 and is positioned for prealignment. Further alignment, if necessary, is accomplished with a low contrast secondary electron image received by detector 145.

The scope of testing on the specimen includes:
(1) connections between top and bottom surfaces of the specimen;
(2) connections between two or more different points on the same surface;
(3) connections within a chip site-intrachip connections.

These tests are performed on:
(1) fixed or repetitive contact patterns; and
(2) part number dependent wiring (personalization).

Figure 13:
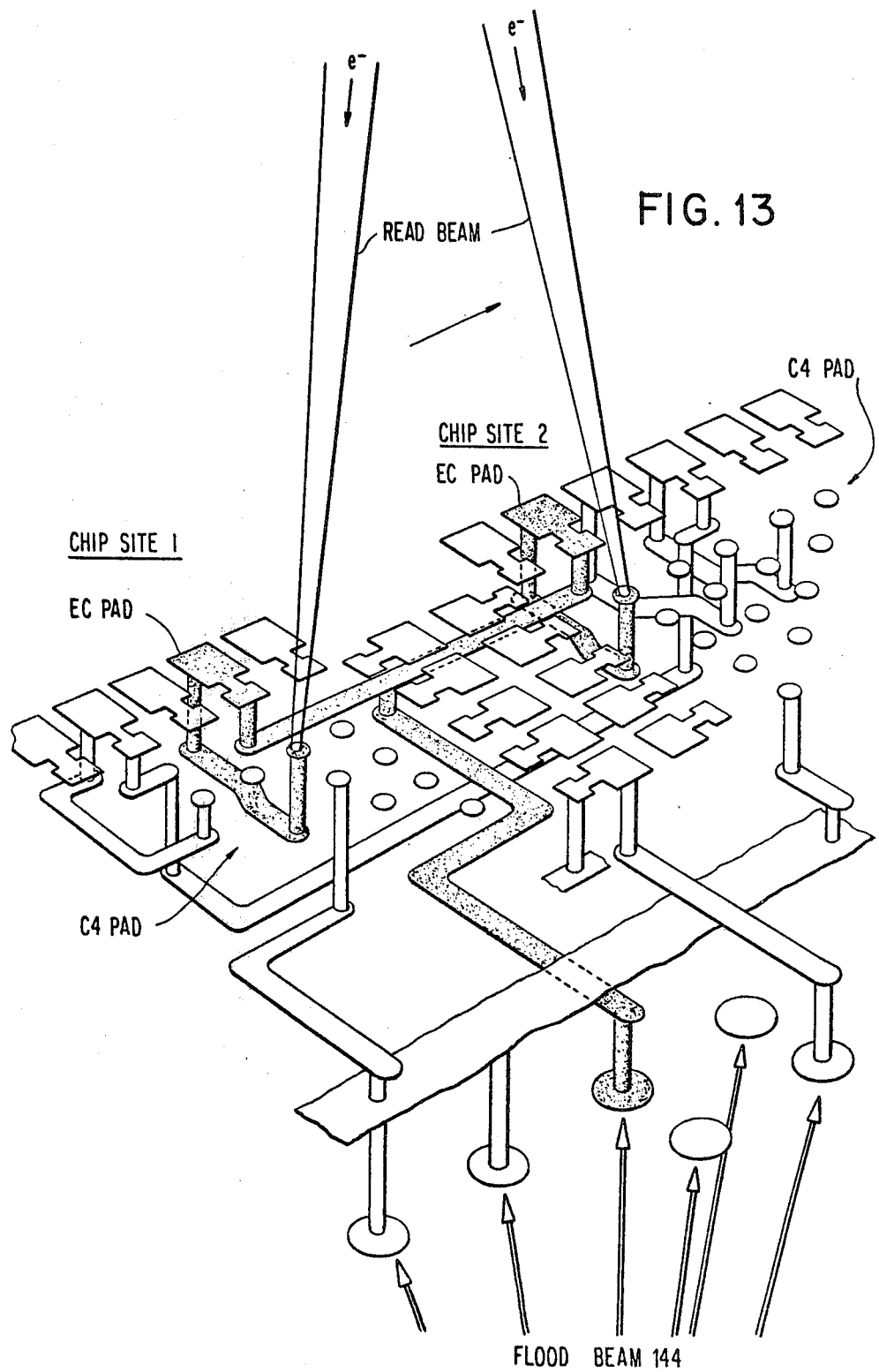
FIG. 13 and FIG. 14 are schematic cutaway perspective views of a specimen showing networks, being inspected.

Referring to FIGS. 11, 12 and 13 testing for top-to-bottom open circuit conditions begins by switching on the lower flood gun 144 to charge the bottom surface of the specimen 136. A top-to-bottom open is shown in FIG. 12 as at point 6'. FIG. 13 shows the most comprehensive case of a top-to-bottom wiring system and chip-to-chip wiring in the signal layer via the EC pads. As shown in the shaded portion a selected C4 pad is coupled to an EC pad in the redistribution layer of each chip site. Hence FIG. 13, portrays a wiring pattern having redistribution as well as personalization wiring. The broad electron beam from the lower flood gun is used to charge the bottom surface and simultaneously all and any of these features on the top surface with galvanic connection to the bottom surface. Accordingly, continuity in the wiring paths is defined, shown in FIG. 13 as the shaded area. The probe gun 112 is then actuated, and by means of the deflection generator 118 acting under control of system controller 138, the top surface is scanned. The negative charge of those features scanned gives rise to the generation of strong secondary emissions, when there is continuity, that is detected by secondary electron emission detector 145. FIG. 13 shows the "read" beam stepped between C4 pads at two chip sites, testing for top-to-bottom continuity.

The energy level of the probe gun 12 is lower than that of the flood gun 144. The flood beam generally has an energy level equal or greater than 2 kV while the read beam or probe from scanning electron beam gun 112 has a lower energy level, less than 2 kV. Detection of open circuit conditions is accomplished in a manner consistent with that disclosed in connection with FIGS. 8–10.

The signal processor 146 is used to provide correlation with stored expected results for each test point. Accordingly, as shown in FIG. 12, values for each of the areas scanned are correlated with a predetermined stored signal so that as scanning is accomplished, a comparison is made to determine if an open circuit exists and, if so, its location. The defect location would be saved. In the case of the specimen shown in FIG. 12, point 6' would be noted.

Referring to FIGS. 11 and 13, testing for top-to-bottom shorts begins by pulsing the lower flood gun 144 to charge all connections in a manner compatible with testing for an open circuit condition. Then, the system controller 138 provides input signals to the deflection generator 118 to scan the top surface features with the probe beam 112. This scan reads and neutralizes the charge at one point of those top surface nets that should be connected to the bottom.

Since continuity of those nets, shaded areas in FIG. 13, has been established in the previous open test, if a subsequently scanned net read out by the beam is already discharged, a short exists to one of those previously scanned nets. By reversing the sequence of the locations scanned, the other net of the shorted pair may be determined.

Figure 14:
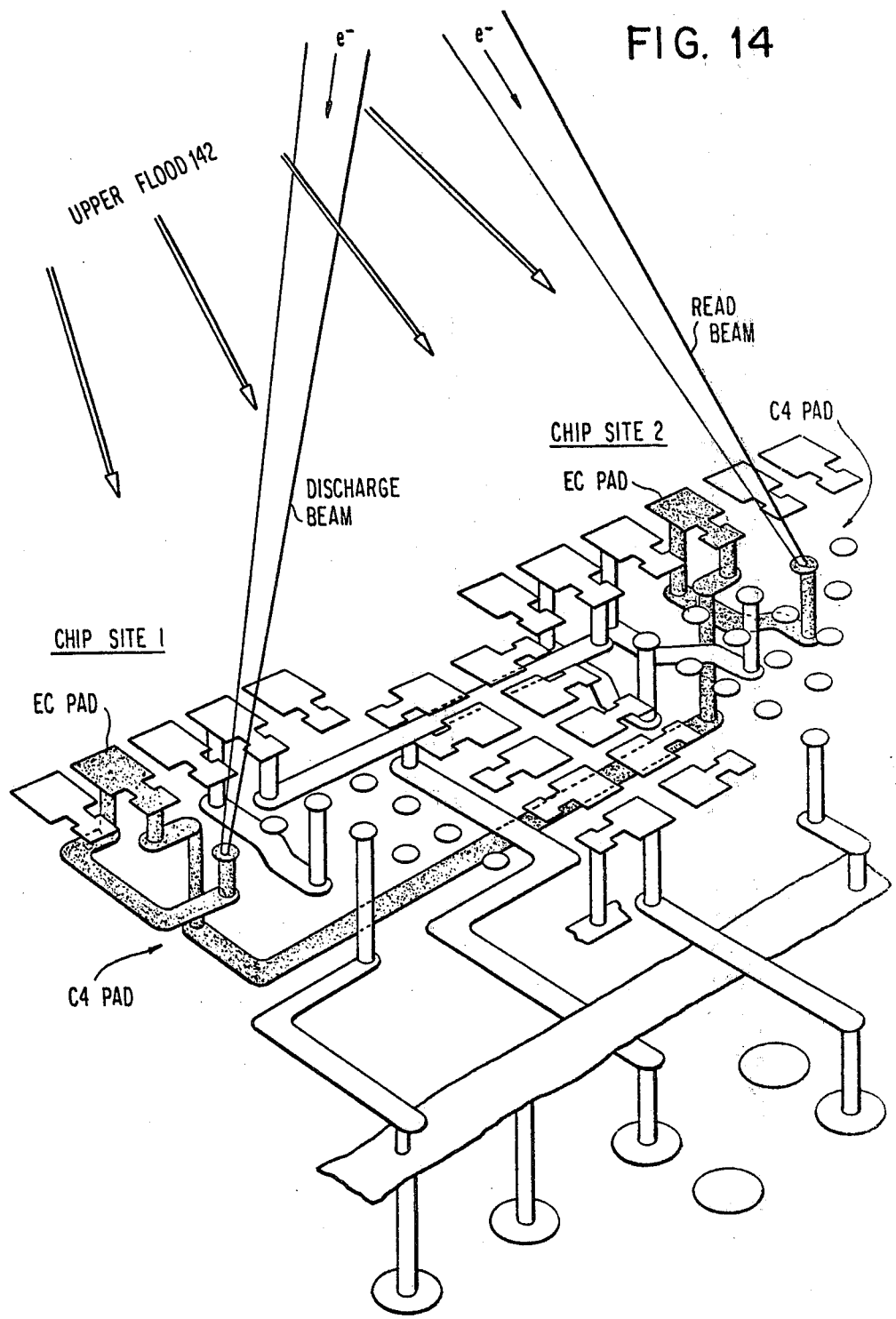

Referring now to FIGS. 11, 12 and 14, the top-to-top test for opens and shorts begins by pulsing the upper flood gun 142 to charge all nets, like the one shown in shading in FIG. 14, having at least an end point on the top surface. FIG. 12 shows net 2'-3' as a top-to-top wiring network to be subjected to such a test. The pulsing of the upper flood gun is terminated before the "read" beam scan commences. The system controller 138 provides input signals to the deflection generator 118 to scan the top surface with probe gun 112. This beam is stepped to and only to the top surface end points of wiring networks. When the beam reads the charge at the first end point of a particular network, it discharges the entire network, if there is no break. It, however, discharges only a part of the network if there is an open. An open is detected, as in the case of FIG. 12, when the beam scans point 3', a subsequent point in the network and "reads" the presence of a charge. Shorts are detected in a manner described for top-to-bottom testing.

Given this basic system architecture, it is apparent that a number of modifications can be accomplished without departing from the essential scope of the system. For example, a dual column system may be utilized wherein a second column identical to column 110 is placed below the specimen 136. The two beams could then be reversible in application, serving alternatively as flood or probe beams depending on the utilization. Beam focusing and dispersion would be accomplished using conventional focusing and deflection techniques. In cases of multiple network endings (i.e., voltage) on both top and bottom surfaces, the specimen may be flipped outside the vacuum chamber 20 and a second set of top-to-bottom and top-to-top testing can be performed. Alternatively, the two column structure may be employed to eliminate specimen flipping.

Another alternative is to use a four-beam system including two guns, modifying the FIG. 11 embodiment by placing a second column system, including flood gun, below the chamber 120. In such a system, each beam would have a fixed application.

In all these arrangements, although the column 110 is shown as having two focusing lenses, a single lens system may be used. Single yoke deflection 116 is satisfactory as long as the resolution requirements are met. Double deflection yokes may be employed for large field coverage.

Various deflection scan patterns, through deflection generator 118, for probe gun 112 may also be accomplished. Although a predetermined step scan was described, the system may utilize various probe scan deflection modes, from a bidirectional step raster to vector scan.

It is apparent, therefore, that given the system architecture as disclosed herein, detection of defects in specimens can be accomplished in an automated mode in a contactless manner. Those specimens with defects can then be sorted for off-line inspection, repair, or rejection as needed. Accordingly, specimen defect recognition and type identification can be made under computer control by system controller 138. The test procedure selection, field size selection, and pattern data retrieval and storage are also accomplished utilizing the system controller 138. The controller also functions for beam control, exposure control of all beams, and deflection control through instructions for deflection generator 118. Defect detection is accomplished by comparison of measured and expected signals by the signal processor 146.

The system controller 138 also functions to control the vacuum/load/unload/table controller 140 providing control for the entire system. Sample selection and loading is accomplished so that input mechanics and logistics are monitored and actuated.

The system operating under computer control provides throughput capacity commensurate with that of other manufacturing steps. Electrical testing without contact for shorts and opens in fired substrates and unfired laminates, sublaminates and green sheets of all types can therefore be accomplished.

It is apparent that other modifications of this system may be accomplished without departing from the essential scope of this invention.

A copending application Ser. No. 267,321 of Chang, Coane, Hohn, Molzen and A. R. Zingher (the inventor hereof) for "Inspection of Unsintered Single Layer or Multilayer Ceramics Using a Broad Area Electrical Contacting Structure" being filed contemporaneously herewith, also relates to electrical inspection and testing the physical continuity of metallic paste lines and vias within an unsintered ceramic substrate. It employs a resilient conforming electrically contacting structure for temporarily making non-damaging uniform physical and electrical contact over relatively large surface areas of the substrate. The structure makes common electrical contact to any metallic paste exposed at the contacted surface area. The subject Chang et al application is incorporated herein by reference for purposes of disclosure of an embodiment of aspects of the instant invention.

U.S. Pat. application Ser. No. 176,949 filed 8/11/80, now U.S. Pat. No. 4,349,862 of Bajorek et al for "Capacitive Chip Carrier Multilayer Ceramic Capacitors" is incorporated by reference herein for the teachings thereof.

U.S. Pat. application Ser. No, 164,119, filed June 30, 1980, now U.S. Pat. No. 4,328,530 for "Multiple Layer, Ceramic Carrier for High Switching Speed VLSI Chips" is also incorporated by reference herein for the teachings thereof.

Both copending application Ser. No. 267,118, now U.S. Pat. No. 4,415,851 Langner and Pfeiffer entitled, "System for Contactless Testing of Multi-Layer Ceramics", and copending application Ser. No. 267,119 now U.S. Pat. No. 4,417,203 of Pfeiffer, Simpson and Stickel entitled, "System for Contactless Electrical Property Testing of Multi-Layer Ceramics", are being filed contemporaneously herewith and are also incorporated by reference herein for the teachings thereof.

Industrial Applicability

A method of manufacturing packages for LSI chips starts with the usual steps of punching holes in green sheets, screening patterning paste (adapted to form cermet conductors or the like after firing) onto the green sheets, and inspecting the green sheets optically. Here, subsets of green sheets are then stacked and compressed into sublaminates. The sublaminates are then functionally inspected electrically. Inspection is done by means of electromechanical contact, scanning electron microscope like techniques, or by other means of irradiating the conductors to energize them for electrical measurement. Measurement may be made between pairs of terminals on only one side of the device being tested, or on both sides of the device. Beams can be applied both top and bottom from a single source or plural sources. Measuring instruments can employ various electromechanical techniques and/or electrons, light used photoelectrically, ions, or pneumatic ion jets. Secondary electrons can measure the specimens potential locally or change its charge. This method can also be employed for the purpose of inspecting other multilayer structures (such as large multilayer printed circuits formed on a plastic base) prior to final assembly of the conductors and the various substrates into a laminated support for electrical circuits. This testing process can also be applied after firing of patterned green sheets prior to plating, as well as after plating. Throughout this application the strong beam and the weak beam may differ in intensity, voltage, duration or may be equal according to several different measuring techniques.

Having thus described my invention, what I claim as new, and desire to secure by Letters Patent is:

1. A method of manufacture of laminated electronic substrates comprising, applying an electrical circuit pattern of patterning paste to a sheet of material and electrically inspecting said sheet prior to assembly into the laminated form, and then laminating said sheet with other sheets wherein said inspection step is performed by a mechanical contact method wherein contacts are applied to said sheet prior to assembly.

2. A method in accordance with claim 1 wherein said step of electrical inspecting is performed with at least one articulated microprobe.

3. A method in accordance with claim 1 wherein said inspecting is performed with mechanical contacts in the form of cats whisker probes with ball tips.

4. A method in accordance with claim 1 wherein said measurement is performed with mechanical contacts in the form of conductive sponges.

5. A method in accordance with claim 1 wherein said inspecting is performed with mechanical contacts in the form of ball contacts on a flexible sheet or membrane pressed pneumatically onto said sheet of material.

6. A method of manufacture of laminated electronic substrates comprising, applying an electrical circuit pattern of patterning paste to a sheet of material and electrically inspecting said sheet prior to assembly into the laminated form, and then laminating said sheet with other sheets wherein said inspection step is performed by a non-mechanical probe method wherein electrical charge is applied to said sheet prior to assembly.

7. The method of claim 6 wherein an electron beam is employed to deposit negative charge on said sheet.

8. The method of claim 6 wherein an electron beam is employed to detach secondary electrons from said sheet.

9. The method of claim 6 wherein an electron beam is employed to measure relative sheet voltage by whether or not the beam is turned around by the sheet.

10. The method of claim 6 wherein an ion beam is employed in conjunction with an electron beam to probe said sheet.

11. The method of claim 6 wherein a pneumatic ion jet is employed to probe said sheet.

12. The method of claim 6 wherein an electrically active optical beam is employed to detach electrons from said sheet.

13. In a method of manufacture of ceramic laminated electron substrates comprising,
applying a past to a number of unfired ceramic sheets, said paste including conductive particles and an insulating material,
and then assembling sheets into complete assemblies,
then laminating by compression,
then sintering and
then planting to form the finished substrate,
the improvement comprising the steps performed prior to the step of assembling of said unfired ceramic sheets into complete assemblies, said steps including
placing at least one of said unfired sheets in a device for electrically inspecting the parameters of the pattern formed by said paste upon said sheets,
comparing thus measured parameters of said pattern with a predetermined set of parameters,
rejecting sheets having improper electrical parameters,
retaining sheets having a proper set of parameters,
thereby avoiding the waste attendant with employing sheets with improper electrical parameters,
wherein said inspecting step is performed by a mechanical contact method wherein contacts are applied to said sheet prior to assembly.

14. A method in accordance with claim 1 wherein said step of electrical inspecting is performed with at least one articulated microprobe.

15. A method in accordance with claim 1 wherein said inspecting is performed with mechanical contacts in the form of cats whisker probes with ball tips.

16. A method in accordance with claim 1 wherein said measurement is performed with mechanical contacts in the form of conductive sponges.

17. A method in accordance with claim 1 wherein said inspecting is performed with mechanical contacts in the form of ball contacts on a flexible sheet or membrane pressed pneumatically onto said sheet of material.

18. In a method of manufacture of ceramic laminated electronic substrates comprising,
applying a paste to a number of unfired ceramic sheets, said paste including conductive particles and an insulating material,
and then assembling sheets into complete assemblies,
then laminating by compression,
then sintering and
then plating to form the finished substrate,
the improvement comprising the steps performed prior to the step of assembling said unfired ceramic sheets into complete assemblies, said steps including
placing at least one of said unfired sheets in a device for electrically inspecting the parameters of the pattern formed by said paste upon said sheets,
comparing thus measured parameters of said pattern with a predetermined set of parameters,
rejecting sheets having improper electrical parameters,
retaining sheets having a proper set of parameters,
thereby avoiding the waste attendant with employing sheets with improper electrical parameters,
wherein said inspecting step is performed by a non-mechanical probe method wherein electrical charge is applied to said sheet prior to assembly.

19. The method of claim 6 wherein an electron beam is employed to deposit negative charge on said sheet.

20. The method of claim 6 wherein an electron beam is employed to detach secondary electrons from said sheet.

21. The method of claim 6 wherein an electron beam is employed to measure relative sheet voltage by whether or not the beam is turned around by the sheet.

22. The method of claim 6 wherein an ion beam is employed in conjunction with an electron beam to probe said sheet.

23. The method of claim 6 wherein a pneumatic ion jet is employed to probe said sheet.

24. The method of claim 6 wherein an electrically active optical beam is employed to detach electrons from said sheet.

25. A method of manufacture of laminated electronic substrates comprising, applying an electrical circuit pattern of patterning paste to a sheet of material and electrically inspecting said sheet prior to assembly into the laminated form, and then laminating said sheet with other sheets, within said sheet includes at least two terminals and said inspecting step is performed by irradiating one of said terminals with a first beam to stimulate said electrical circuit pattern, and irradiating another terminal of said electrrical circuit pattern with another beam to sense emission to sense an electrical response.

26. In a method of manufacture of ceramic laminated electronic substrates comprising,
applying a paste to a number of unfired ceramic sheets, said paste including conductive particles and an insulating material,
and then assembling sheets into complete assemblies,
then laminating by compression,
then sintering and
then plating to form the finished substrate,
the improvement comprising the steps performed prior to the step of assembling of said unfired ceramic sheets into complete assemblies, said steps including
placing at least one of said unfired sheets in a device for electrically inspecting the parameters of the pattern formed by said paste upon said sheets,
comparing thus measured parameters of said pattern with a predetermined set of parameters,
rejecting sheets having improper electrical parameters,
retaining sheets having a proper set of parameters,
thereby avoiding the waste attendant with employing sheets with improper electrical parameters,
wherein said sheet includes at least two terminals and said inspecting step is performed by irradiating one of said terminals with a first beam to stimulate said electrical circuit pattern, and irradiating another terminal of said electrical circuit pattern with another beam to sense emission to sense an electrical response.

27. The method of claim 25 wherein said first beam is an electron beam applied to one end of said sheet and said other beam is a steerable electron beam scanned on the opposite end of said sheet, and detecting the emission of secondary electrons from said opposite end to determine the electrical conduction through said electrical connections or interruption of said connections.

28. The method of claim 26 wherein said first beam is an electron beam applied to one end of said sheet and said other beam is a steerable electron beam scanned on the opposite end of said sheet, and detecting the emission of secondary electrons from said opposite end to determine the electrical conduction through said electrical connections or interruption of said connections.

29. A method of manufacture of laminated electronic substrates comprising, applying an electrical circuit pattern of patterning paste to a sheet of material and electrically inspecting said sheet prior to assembly into the laminated form, and then laminating said sheet with said other sheets, wherein said patterning paste is composed of a binder and conductive particles.

30. A method of manufacture of laminated electronic substrates comprising, applying an electrical circuit pattern of patterning paste to a sheet of material and electrically inspecting said sheet prior to assembly into the laminated form, and then laminating said sheet with other sheets, wherein said patterning paste is composed of a binder of an organic dielectric material and metallic particles.

31. A method of manufacture of laminated electronic substrates comprising, applying an electrical circuit pattern of patterning paste to a sheet of material and electrically inspecting said sheet prior to assembly into the laminated form, and then laminating said sheet with other sheets, wherein said paste comprises a poor conductor of electricity.

32. A method in accordance with claim 31 wherein said paste comprises an insulator containing conductive particles.

* * * * *